US006989201B2

(12) United States Patent
Satou et al.

(10) Patent No.: US 6,989,201 B2
(45) Date of Patent: *Jan. 24, 2006

(54) THIN FILM EL DEVICE

(75) Inventors: Tetsuya Satou, Kadomi (JP); Mikiko Matsuo, Nara (JP); Hisanori Sugiura, Hirakata (JP); Hitoshi Hisada, Toyonaka (JP); Ryuichi Shingae, Neyagawa (JP); Yoshinobu Murakami, Katano (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/718,554

(22) Filed: Nov. 24, 2003

(65) Prior Publication Data

US 2004/0076854 A1 Apr. 22, 2004

Related U.S. Application Data

(63) Continuation of application No. 09/913,644, filed as application No. PCT/JP00/09064 on Dec. 20, 2000, now Pat. No. 6,682,832.

(30) Foreign Application Priority Data

Dec. 20, 1999 (JP) .............................. H11-360247
May 31, 2000 (JP) .............................. 2000-162031

(51) Int. Cl.
 *H05B 33/14* (2006.01)

(52) U.S. Cl. .................. 428/690; 428/917; 313/504

(58) Field of Classification Search ........... 428/690, 428/704, 917; 313/504, 506; 257/40; 564/305, 564/433

See application file for complete search history.

(56) References Cited

U.S. PATENT DOCUMENTS

| 4,720,432 A | 1/1988 | VanSlyke et al. ............ 428/457 |
| 5,635,308 A | 6/1997 | Inoue et al. ................. 428/690 |
| 5,792,557 A | 8/1998 | Nakaya et al. ............ 428/411.1 |
| 6,280,859 B1 | 8/2001 | Onikubo et al. ............. 428/690 |
| 6,541,129 B1 | 4/2003 | Kawamura et al. ......... 428/690 |
| 6,682,832 B2 * | 1/2004 | Satou et al. ................. 428/690 |
| 2001/0033944 A1 | 10/2001 | Onikubo et al. ............. 428/690 |
| 2003/0143430 A1 | 7/2003 | Kawamura et al. ......... 428/690 |
| 2003/0207153 A1 | 11/2003 | Sanoo et al. ................. 428/690 |

FOREIGN PATENT DOCUMENTS

| JP | 06-240245 | 8/1994 |
| JP | 07-157754 | 6/1995 |
| JP | 7-188130 | 7/1995 |
| JP | 07-216352 | 8/1995 |
| JP | 07-249490 | 9/1995 |
| JP | 08-012969 | 1/1996 |
| JP | 8-48656 | 2/1996 |
| JP | 08-302341 | 11/1996 |
| JP | 08-311442 | 11/1996 |
| JP | 08-333569 | 12/1996 |
| JP | 09-268284 | 10/1997 |
| JP | 10-245549 | 9/1998 |
| JP | 10-251633 | 9/1998 |
| JP | 11-74079 | 3/1999 |
| JP | 11-255716 | 9/1999 |
| JP | 2000-16973 | 1/2000 |
| JP | 2000-309566 | 11/2000 |

* cited by examiner

*Primary Examiner*—Marie Yamnitzky
(74) *Attorney, Agent, or Firm*—Steptoe & Johnson LLP

(57) ABSTRACT

A thin film EL device having high electroluminescent efficiency, a low operating voltage, and a long lifetime. A thin film EL device of the present invention uses, as a luminescent layer, a charge-transport luminescent material that has, within a molecule, a portion contributing to charge transport and a portion contributing to luminescence where at least two molecular orbitals contributing to luminescent transition are localized.

31 Claims, 1 Drawing Sheet

THIN FILM EL DEVICE

This application is a continuation of U.S. application Ser. No. 09/913,644, filed Aug. 17, 2001, now U.S. Pat. No. 6,682,832, which is a 371 of PCT/JP00/09064, filed Dec. 20, 2000.

TECHNICAL FIELD

The present invention relates to thin film EL (electroluminescent) devices and to self-luminous devices that can be used as various kinds of light sources for, for example, self-luminous flat panel displays, telecommunications, lighting, and other applications.

BACKGROUND ART

In recent years, LCD panels have been widely used for flat panel displays. However, such panels still have several drawbacks such as slow response time and narrow viewing angle. In addition, even in many new systems in which these drawbacks are redressed, there still remain several problems, including unsatisfactory performance and increasing costs in the manufacturing of panels. In these circumstances, thin film EL devices are attracting attention as new light-emitting devices that have excellent visibility because of self-luminosity, high-speed response, and widespread applicability. In particular, organic EL devices, thin film EL devices that use, in all or part of the layers, organic materials, allowing for a simple film-forming step such as vapor deposition or coating at room temperature, have been the focus of much research, as these devices are attractive in terms of manufacturing cost as well as the above-mentioned characteristics.

In thin film EL devices (organic EL devices), the light emission arises from the recombination of electrons and holes injected from electrodes. Research on such devices has long been conducted; however, since the electroluminescent efficiency of these devices was generally low, their practical applications for light emitting devices was still a long way off.

In the meantime, a device was proposed by Tang et al. in 1987 (C. W Tang and S. A. Vanslyke, Appl. Phys. Lett., 51, 1987, pp. 913.) comprising a hole-injecting electrode (anode), a hole-transporting layer, a luminescent layer, and an electron-injecting electrode (cathode) on a transparent substrate wherein ITO (Indium Tin Oxide) was employed as the anode, a 75-nm-thick layer of diamine derivative as the hole-transporting layer, a 60-nm-thick layer of aluminum quinoline complex as the luminescent layer, and an MgAg alloy having electron-injection properties and stability as the cathode. This device not only made improvement in the cathode but also formed a thin film which had satisfactory transparency even with a film thickness of 75 nm and which was uniform and free from pinholes and the like by employing a diamine derivative, having excellent transparency, for the hole-transporting layer. Thus, because reduction in the device's total film thickness became possible, light emission having high luminance with relatively low voltages could be achieved. Specifically, with a low voltage of 10 V or less the device achieved a high luminance of 1000 $cd/m^2$ or more and a high efficiency of 1.5 lm/W or higher. This report led by Tang et al. spurred further investigation into improvements in cathodes, suggestions on device constructions, and so forth, and this active investigation has continued to the present.

Thin film EL devices, generally investigated today, are outlined below.

In addition to a thin film EL device, such as one described in the above-mentioned report, having a laminate structure of an anode, a hole-transport layer, a luminescent layer, and a cathode formed on a transparent substrate, a device may comprise a hole-injecting layer formed between an anode and a hole-transport layer, may comprise an electron-transport layer formed between a luminescent layer and a cathode, or may comprise an electron-injecting layer formed between the electron-transport layer and the cathode. Thus, by assigning functions to each individual layer separately, it becomes possible to select suitable materials for each layer, resulting in improvement in device characteristics.

For the transparent substrate, a glass substrate such as Corning 1737 is widely used. A substrate thickness of about 0.7 mm is convenient for use in terms of its strength and weight.

For the anode, a transparent electrode such as an ITO-sputtered film, an electron-beam evaporated film, or an ion-plated film is used. The film thickness is determined by the sheet resistance and visible light transmittance required; however, since thin film EL devices have relatively high operating current densities, in most cases, the film thicknesses are made to be 100 nm or more so as to reduce the sheet resistances.

For the cathode, an alloy of a low work function metal with a low electron injection barrier and a relatively high work function, stable metal, such as an MgAg alloy proposed by Tang et al. or an AlLi alloy, is used.

For the layers sandwiched between the anode and the cathode, many devices have a laminate structure, for example, of a hole-transport layer formed to a thickness of about 80 nm by vacuum vapor deposition of a diamine derivative (Q1-G-Q2 structure) used by Tang et al. such as N,N'-bis (3-methylphenyl)-N,N'-diphenylbenzidine (TPD) or N,N'-bis (α-naphthyl) -N,N'-diphenylbenzidine (NPD) and a luminescent layer formed to a thickness of about 40 nm by vacuum vapor deposition of an electron-transport luminescent material such as tris(8-quinolinolato) aluminum. In this structure, in order to increase luminance, generally, a luminescent layer is doped with a luminescent dye.

In addition, in view of the general difficulty in obtaining an organic compound having excellent electron-transport properties such as one described above, it has also been suggested that in the luminescent layer/electron-transport layer structure and in the hole-transport layer/luminescent layer/electron-transport layer structure a hole-transport luminescent material be used for the luminescent layer.

For example, Japanese Unexamined Patent Publication No. 2-250292 discloses a device having the hole-transport luminescent layer/electron-transport layer structure that uses, as the hole-transport luminescent material, [4-{2-(naphthalene-1-yl)vinyl}phenyl]bis(4-methoxyphenyl) amine or [4-(2,2-diphenylvinyl)phenyl]bis(4-methoxyphenyl) amine.

International Patent Publication No. WO96/22273 discloses a device having the hole-transport layer/hole-transport luminescent layer/electron-transport layer structure that uses, as the hole-transport luminescent material, 4,4'-bis(2,2-diphenyl-1-vinyl)-1,1'-biphenyl.

At the 1998 MRS Spring Meeting, Symposium G2.1, the hole-injecting layer/hole-transport luminescent layer/hole blocking layer/electron-transport layer structure that uses NPD as the hole-transport luminescent material was disclosed.

Further, Japanese Unexamined Patent Publications No. 10-72580 and No. 11-74079 also disclose various hole-transport luminescent materials.

Thus, using a hole-transport luminescent material as well as an electron-transport luminescent material as the luminescent material allows for the design of a wide range of materials, which in turn provides various luminous colors. However, in terms of electroluminescent efficiency, lifetimes, and so forth, it cannot be said that expectations have been met.

When devices are used in the passive-matrix line-at-a-time scanning displays, in particular, in order to attain a prescribed average luminance, peak luminance needs to be increased to very high levels. This increases the operating voltage, causing the problem of increasing power consumption as a result of power loss or the like caused by wiring resistance. Further, other problems arise, such as an increase in the cost for drive circuits and a decrease in reliability. Furthermore, devices tend to have shorter lifetimes as compared to ones used under conditions of continuous light-emission.

In addition, even with devices having high electroluminescent efficiency and relatively low operating voltages at direct current operation, when the duty ratio increases during operation, the operating voltage required to attain a prescribed average luminance is rapidly increased and also the electroluminescent efficiency itself is reduced as the operating voltage increases.

Moreover, the above-mentioned [4-{2-(naphthalene-1-yl)vinyl}phenyl] bis(4-methoxyphenyl)amine and [4-(2,2-diphenylvinyl)phenyl]bis(4-methoxyphenyl)amine, disclosed in Japanese Unexamined Patent Publication No. 2-250292, have relatively good hole-transport properties and high fluorescent yield. However, since both compounds are low-molecular-weight compounds, they suffer from the problems of low heat-resistance and particularly a short lifetime. In addition, because the compounds require luminescent dye doping, there is a problem concerning manufacturing.

The above-mentioned 4,4'-bis(2,2-diphenyl-1-vinyl)-1,1'-biphenyl, disclosed in International Patent Publication No. WO96/22273, is somewhat superior in terms of heat-resistance as compared to the above-mentioned compounds. However, since the structure of the compound is completely symmetric, the molecules easily become associated with each other, reducing electroluminescent efficiency due to microscopic crystallization and aggregation. Because of this, devices using this kind of compound are unable to obtain satisfactory lifetime when used under conditions of continuous light-emission. In addition, since the compound requires luminescent dye doping, there is a problem concerning manufacturing.

For the above-mentioned Q1-G-Q2 type compound, such as one disclosed in the 1998 MRS Spring Meeting, Symposium G2.1, besides TPD and NPD, the trimers of and the tetramers of triphenylamine have also been reported. As for their heat resistance, it has been reported that they have sufficient levels of heat resistance. However, since these compounds also have high molecular symmetry, the molecules easily become associated with each other, reducing electroluminescent efficiency due to microscopic crystallization and aggregation. Because of this, here also, devices using this kind of compound are unable to obtain satisfactory lifetimes under continuous use. Particularly when the devices are operated at high duty cycles, difficulties arise in achieving satisfactory electroluminescent efficiency and low operating voltages. In addition, since the compounds require luminescent dye doping, there is a problem concerning manufacturing.

Devices using the above-mentioned hole-transport luminescent materials disclosed in Japanese Unexamined Patent Publications No. 10-72580 and No. 11-74079 do not require luminescent dye doping, and thus are advantageous with regard to manufacturing. However, the devices have not yet achieved satisfactory electroluminescent efficiency.

DISCLOSURE OF THE INVENTION

In view of the foregoing and other problems, it is an object of the present invention to provide a thin film EL device that achieves high electroluminescent efficiency, a low operating voltage, and a long lifetime even when the device is operated with direct current or at high duty cycles.

In order to achieve the above-mentioned objects, the present inventors designed materials having various structures and made predictions about more specific properties of the materials by computer simulations. Thereafter, various compounds were actually synthesized and fabricated into thin film EL devices. The inventors then obtained experimental data on the electroluminescent characteristics and lifetimes of the devices for both direct current operation and high duty cycle operation. From an enormous amount of these experimental data, the inventors found that when some specific groups of compounds were used as the luminescent material, the devices characteristically achieved extremely high electroluminescent efficiency, low operating voltages, and exceptionally long lifetimes over a wide range of operating duty cycles, from a direct current to 1/240.

In addition, the molecular orbitals (HOMO and LUMO) of the specific groups of compounds were observed. The results of the observations showed that each individual molecular orbital was localized within a molecule. On the other hand, the hole transporting luminescent materials disclosed in Japanese Unexamined Patent Publications No. 10-72580 and No. 11-74079 were found to have HOMO and LUMO, which are orbitals contributing to luminescent transition, spreading throughout the molecule. From these data and observations, the present inventors found that it is effective in improving in electroluminescent efficiency and so forth when either a hole-transport luminescent material or an electron-transport luminescent material (collectively referred to as "charge-transport luminescent material") has at least two molecular orbitals contributing to luminescent transition such that the two orbitals are localized within a molecule and overlap one another. Thus, the present invention was accomplished.

According to one aspect of the present invention there is provided a thin film EL device comprising at least:
a hole-injecting electrode;
an electron-injecting electrode opposed to the hole-injecting electrode;
and
a luminescent layer sandwiched between the hole-injecting electrode and the electron-injecting electrode, said luminescent layer containing a charge-transport luminescent material having, within a molecule, a portion contributing to charge transport and a portion contributing to luminescence where at least two molecular orbitals contributing to luminescent transition are localized.

As with the above-mentioned structure, by using a material having a portion contributing to luminescence where at least two molecular orbitals contributing to luminescent transition are localized, because the spatial overlap of the molecular orbitals contributing to luminescent transition is large, the energy of a hole-electron recombination can be utilized more efficiently. Therefore, high electroluminescent efficiency is achieved. Furthermore, since energy utilization efficiency is high, it is also possible to reduce the operating voltage and extend the lifetime.

The term "portion contributing to charge transport" is herein defined as a portion which is part of the molecular structure of the charge-transport luminescent material and which contributes to electron transport by hopping. One such example is a tetraphenyl phenylenediamine skeleton.

The term "portion contributing to luminescence" is herein defined as a portion which is part of the molecular structure of the charge-transport luminescent material and which includes all molecular orbitals contributing to luminescent transition. One such example is an anthracene skeleton. It should be noted that this is the portion that emits light.

The term "molecular orbitals contributing to luminescent transition" is herein defined as orbitals that change the status at light emission, and the orbitals include at least two orbitals, HOMO and LUMO. It should be noted that the molecular orbitals can be obtained from a calculation in a conventional manner by using, for example, Chem3D available from CambridgeSoft Corporation, or the MOPAC 97 engine incorporated in WinMOPAC available from Fujitsu Ltd. In addition, each orbital is defined herein to mean, based on the above calculation results, the smallest spatial extent covering 90% or more of the probability of existence of electrons.

According to another aspect of the present invention the above-mentioned thin film EL device may be such that an electron cloud of the portion contributing to charge transport and an electron cloud of the portion contributing to luminescence are localized such that the electron clouds substantially do not overlap each other.

As with the above-mentioned structure, when the electron cloud of the portion contributing to charge transport and the electron cloud of the portion contributing to luminescence are localized such that the electron clouds are substantially separated from each other, the charge transport properties and the luminescent properties can be exhibited individually in different places within a molecule. In addition, quenching due to the interaction between the electron clouds can be suppressed. Consequently, a device is obtained that achieves high electroluminescent efficiency, a low operating voltage, and an extended lifetime.

The term "electron cloud of the portion contributing to charge transport" is defined herein to mean the smallest spatial extent covering 90% or more of the probability of existence of all the electrons that are related to charge transport within a molecule.

The "electron cloud of the portion contributing to luminescence" is defined herein to mean the smallest spatial extent which spatially includes at least two molecular orbitals selected from the molecular orbitals contributing to the above-mentioned luminescent transition and which covers 90% or more of the probability of existence of all the electrons that are related to luminescence within a molecule.

Specifically, the term "being localized such that the electron clouds substantially do not overlap each other" herein includes the case where there is no overlap between electron clouds that are defined by the spatial extent in which the probability of existence of all the electrons is 90% but there is overlap between electron clouds in the spatial extent in which the probability of existence of all the electrons is over 90%. As described above, the electron clouds of each portion being localized such that the electron clouds do not overlap each other are advantageous in exhibiting the function; it should be noted, however, that the case where electron clouds are localized such that the electron clouds do not overlap each other at all is not realistic, and thus such a term is used.

According to another aspect of the present invention the above-mentioned thin film EL device may be such that the portion contributing to charge transport and the portion contributing to luminescence are connected by a carbon-carbon bond.

As with the above-mentioned structure, when the portion contributing to luminescence and the portion contributing to charge transport are connected by a carbon-carbon bond, at least two molecular orbitals contributing to luminescent transition are localized without spreading throughout the molecule, and the electron clouds of each portion are localized such that the electron clouds substantially do no overlap each other. Consequently, a device is obtained capable of exhibiting high charge transport and luminescent properties.

The term "being connected by a carbon-carbon bond" herein includes not only a direct single bond between a carbon atom contained in the portion contributing to luminescence and a carbon atom contained in the portion contributing to charge transport, but also a bond through a divalent group consisting of carbon and hydrogen atoms, such as an alkylene group and an arylene group. For such a divalent group, one having about 1 to 10 carbons is suitable. However, the "carbon-carbon bond" does not include a bond through nitrogen atoms or the like, a direct carbon-carbon double bond, and a direct carbon-carbon triple bond because these may hinder the localization of molecular orbitals.

According to another aspect of the present invention the above-mentioned thin film EL device may be such that the charge-transport luminescent material is a compound having an asymmetric and nonplanar molecular structure.

As with the above-mentioned structure, when the molecular structure is asymmetric and nonplanar, amorphous characteristics and non-associating properties are exhibited, and therefore quenching due to the interaction between each of the portions contributing to luminescence of adjacent molecules or the like can be suppressed. As a result, a device is obtained that has high electroluminescent efficiency.

The term "asymmetric and nonplanar" is defined herein to mean that the molecular structure at its most stable state is not symmetric with respect to a point, a line, or a plane, but is three dimensional.

According to another aspect of the present invention the above-mentioned thin film EL device may be such that the portion contributing to luminescence is present within the luminescent layer at $1 \times 10^{20}$ to $1 \times 10^{21}$ per 1 $cm^3$.

As with the above-mentioned structure, when the portion contributing to luminescence is present within the luminescent layer at a specific density, a device is obtained that achieves high luminance with high electroluminescent efficiency. This can be explained by the fact that when the density of the portion contributing to luminescence is too low, sufficient luminance tends not to be obtained; on the contrary, when the density is too high, quenching occurs due to the interaction between the portions contributing to luminescence, and thus electroluminescent efficiency tends to be degraded.

Here, the number of the portions contributing to luminescence is counted per portion; for example, when the charge-transport luminescent material has two portions contributing to luminescence within a molecule, the number of the portions contributing to luminescence per unit area equals a value that is double the number of molecules per unit area.

According to another aspect of the present invention the above-mentioned thin film EL device may be such that the volume ratio of the portion contributing to luminescence is lower than that of the portion contributing to charge transport.

As with the above-mentioned structure, when the volume ratio of the portion contributing to luminescence is lower than that of the portion contributing to charge transport, the possibility of quenching due to the interaction between the portions contributing to luminescence is suppressed. Consequently, a device is obtained that achieves high electroluminescent efficiency.

The term "volume ratio" is herein defined as the ratio of the volume occupied by the portion contributing to luminescence and the like to the total volume of a molecule having the portion contributing to luminescence and the like.

According to another aspect of the present invention the above-mentioned thin film EL device may be such that the portion contributing to charge transport is of a diaryl diphenyl arylenediamine skeleton.

This skeleton is particularly excellent in charge-transport properties, and thus a thin film EL device is obtained that has particularly good electroluminescent efficiency and so forth. Above all, a tetraphenyl phenylenediamine skeleton, such as a tetraphenyl-p-phenylenediamine skeleton and a tetraphenyl-m-phenylenediamine skeleton, is suitable.

According to another aspect of the present invention the above-mentioned thin film EL device may be such that the portion contributing to luminescence is an aryl group containing five or more conjugated bonds.

Such an aryl group has high luminance, and thus a thin film EL device is obtained that has advantages of low operating voltages and so forth. Above all, an anthracene skeleton is suitable.

According to another aspect of the present invention the above-mentioned thin film EL device may be such that an electron-donating substituent is directly bonded to the portion contributing to luminescence.

As with the above-mentioned structure, when an electron-donating substituent is directly bonded to the portion contributing to luminescence, the localization of molecular orbitals contributing to luminescent transition is further increased, and thus a device is obtained that achieves higher electroluminescent efficiency.

According to another aspect of the present invention the above-mentioned thin film EL device may be such that the charge is a hole.

According to another aspect of the present invention there is provided a thin film EL device comprising at least:
a hole-injecting electrode;
an electron-injecting electrode opposed to the hole-injecting electrode;
and
a luminescent layer sandwiched between the hole-injecting electrode and the electron-injecting electrode, the luminescent layer containing a compound represented by the following general formula (1):

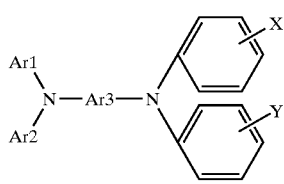

(1)

where Ar1 and Ar2 may be the same or different, and each independently represents a substituted or unsubstituted aryl group; Ar3 represents a substituted or unsubstituted arylene group; X represents a substituent containing two or more carbon rings and non-planarly bonding to a diphenylamine portion; and Y represents a substituted or unsubstituted aryl group containing five or more conjugated bonds.

In the above-mentioned compound, the portion contributing to hole transport is of a diaryl diphenyl arylenediamine skeleton and the portion contributing to luminescence includes Y. When a compound having such a molecular structure is used, a device is obtained capable of exhibiting high hole-transport and luminescent properties. Particularly, when the portion contributing to luminescence is Y (excluding substitutes when Y is substituted), at least two molecular orbitals contributing to luminescent transition are localized, and an electron cloud of the portion contributing to luminescence and an electron cloud of the portion contributing to hole transport are localized such that the electron clouds substantially do not overlap each other, and thus a superior device is obtained. Consequently, a device using the above-mentioned compound as the hole-transport luminescent material achieves high electroluminescent efficiency, a low operating voltage, and an extended lifetime.

According to another aspect of the present invention the above-mentioned thin film EL device may be such that the compound represented by the general formula (1) has a portion contributing to luminescence where at least two molecular orbitals contributing to luminescent transition are localized.

As with the above-mentioned structure, when at least two molecular orbitals contributing to luminescent transition are localized, because the spatial overlap of the molecular orbitals is large, the efficiency of energy utilization of a hole-electron recombination is increased. Thus, a thin film EL device is obtained that achieves high electroluminescent efficiency.

According to another aspect of the present invention the above-mentioned thin film EL device may be such that the X in the general formula (1) is a substituent represented by the following general formula (2):

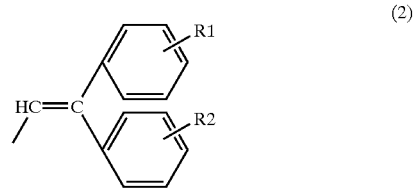

(2)

where R1 and R2 may be the same or different, and each independently represents a hydrogen atom or an alkyl group.

As with the above-mentioned structure, when the X in the general formula (1) is a bulky substituent such as one represented by the general formula (2), this portion becomes twisted and thus the molecules of the hole-transport luminescent material become asymmetric and nonplanar. Thus, molecular association, crystallization, and the like are less likely to occur, resulting in a device achieving high electroluminescent efficiency.

According to another aspect of the present invention the above-mentioned thin film EL device may be such that the X in the general formula (1) is a substituent represented by the following general formula (3):

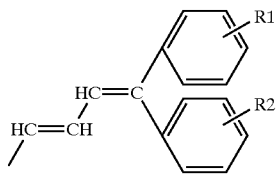

(3)

where R1 and R2 may be the same or different, and each independently represents a hydrogen atom or an alkyl group.

The substituent represented by the above-mentioned general formula (3) is a bulky substituent in which a vinyl group is bonded to a substituent represented by the above-mentioned formula (2). Thus, molecular association, crystallization, and the like are less likely to occur, resulting in a device achieving high electroluminescent efficiency and so forth.

According to another aspect of the present invention the above-mentioned thin film EL device may be such that the X in the general formula (1) is a substituent represented by the following general formula (4):

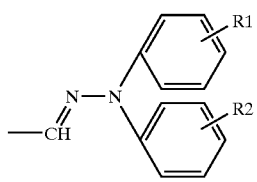

(4)

where R1 and R2 may be the same or different, and each independently represents a hydrogen atom or an alkyl group.

The substituent represented by the above-mentioned general formula (4) is a bulky substituent having nitrogen. Thus, hole-transport properties can be improved and the molecules become asymmetric and nonplanar. Therefore, molecular association, crystallization, and the like are less likely to occur, resulting in a device achieving high electroluminescent efficiency and so forth.

According to another aspect of the present invention the above-mentioned thin film EL device may be such that the X in the general formula (1) is a substituent represented by the following general formula (5):

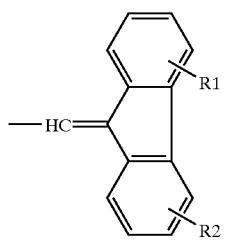

(5)

where R1 and R2 may be the same or different, and each independently represents a hydrogen atom or an alkyl group.

The substituent represented by the above-mentioned general formula (5) is a bulky substituent having a fluorene skeleton. Thus, the molecules become asymmetric and nonplanar, and therefore molecular association, crystallization, and the like are less likely to occur. Consequently, a device is obtained that achieves high electroluminescent efficiency and so forth.

According to another aspect of the present invention the above-mentioned thin film EL device may be such that the Y in the general formula (1) is an aryl group substituted with an electron-donating substituent.

As with the above-mentioned structure, when Y is substituted with an electron-donating substituent, the localization of molecular orbitals contributing to luminescent transition is increased, resulting in a device achieving higher electroluminescent efficiency.

According to another aspect of the present invention the above-mentioned thin film EL device may be such that the Ar3 in the general formula (1) is a p-phenylene group.

As with the above-mentioned structure, when Ar3 is a p-phenylene group, high electroluminescent efficiency is realized and organic synthesis can be achieved easily, providing a cost advantage.

According to another aspect of the present invention the above-mentioned thin film EL device may be such that the Ar3 in the general formula (1) is an m-phenylene group.

As with the above-mentioned structure, when Ar3 is an m-phenylene group, hole-transport properties of the portion contributing to hole transport are improved, resulting in a device achieving high electroluminescent efficiency and a low operating voltage.

According to another aspect of the present invention the above-mentioned thin film EL device may be such that the hole-transport luminescent material is a compound represented by the following general formula (6):

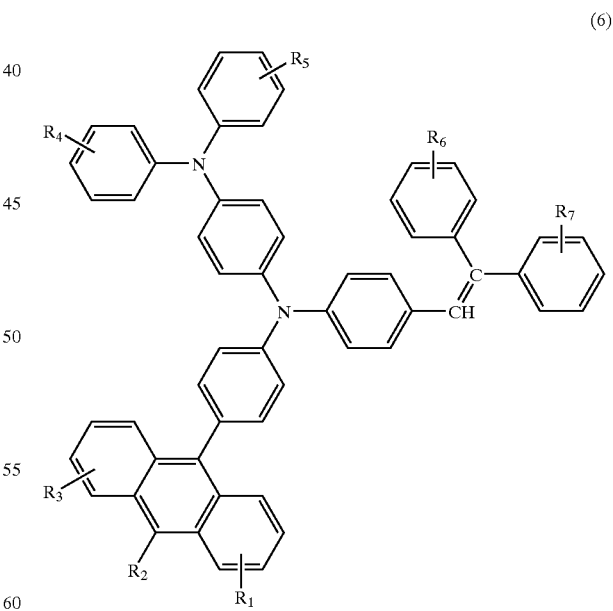

(6)

where R4, R5, R6, and R7 may be the same or different, and each independently represents a hydrogen atom, an alkyl group, or an alkoxy group; and R1, R2, and R3 may be the same or different, and each independently represents a hydrogen atom or an electron-donating substituent.

In the above-mentioned compound, the portion contributing to hole transport is of a tetraphenyl-p-phenylenediamine skeleton and the portion contributing to luminescence is an anthryl group. One phenyl group of diphenylamine is substituted with the above-mentioned anthryl group and the other is substituted with a substituted or unsubstituted 2,2-diphenylvinyl group. Such compound has a portion contributing to luminescence where at least two molecular orbitals contributing to luminescent transition are localized, and an electron cloud of the portion contributing to luminescence and a molecular cloud of the portion contributing to hole transport are localized such that the electron cloud and the molecular cloud do not overlap each other. Further, since a bulky substituent, a 2,2-diphenylvinyl group, is bonded, this portion becomes twisted and thus the molecules become asymmetric and nonplanar. Thus, a thin film EL device is obtained that achieves high electroluminescent efficiency, a low operating voltage, and an extended lifetime even when the device is operated at a wide range of operating conditions, from a direct current to high duty cycles.

A compound represented by the above-mentioned general formula (6) may be (4-{[4-(2,2-diphenylvinyl)phenyl][4-(9-anthryl)phenyl]amino}phenyl)diphenylamine, (4-{[4-(2,2-diphenylvinyl)phenyl][4-(10-methoxy(9-anthryl))phenyl]amino}phenyl)diphenylamine, or the like.

In this patent specification, the names of compounds used herein were named so as to conform to IUPAC nomenclature rules. Specifically, the compounds were named using Chemistry 4-D Draw (available from ChemInnovation Software, Inc.) based on the structural formulae for each compound.

According to another aspect of the present invention the above-mentioned thin film EL device may be such that a compound represented by the following general formula (7) is used as the hole-transport luminescent material:

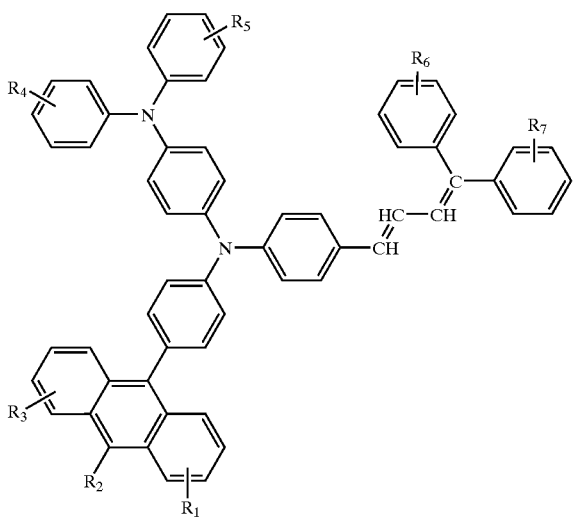

(7)

where R4, R5, R6, and R7 may be the same or different, and each independently represents a hydrogen atom, an alkyl group, or an alkoxy group; and R1, R2, and R3 may be the same or different, and each independently represents a hydrogen atom or an electron-donating substituent.

The above-mentioned hole-transport luminescent material includes an anthryl group, corresponding to the portion contributing to luminescence, and a tetraphenyl-p-phenylenediamine skeleton, corresponding to the portion contributing to hole transport, and further includes a bulky substituent, a substituted or unsubstituted 4,4-diphenylbuta-1,3-dienyl group. Thus, a thin film EL device is obtained that achieves particularly high electroluminescent efficiency, a low operating voltage, and an extended lifetime even when the device is operated at various operating conditions.

A compound represented by the above-mentioned general formula (7) may be (4-{[4-(4,4-diphenylbuta-1,3-dienyl)phenyl][4-(9-anthryl)phenyl]amino}phenyl)diphenylamine, (4-{[4-(4,4-diphenylbuta-1,3-dienyl)phenyl] [4-(10-methoxy(9-anthryl))phenyl]amino}phenyl)diphenylamine, or the like.

According to another aspect of the present invention the above-mentioned thin film EL device may be such that the hole-transport luminescent material is a compound represented by the following general formula (8):

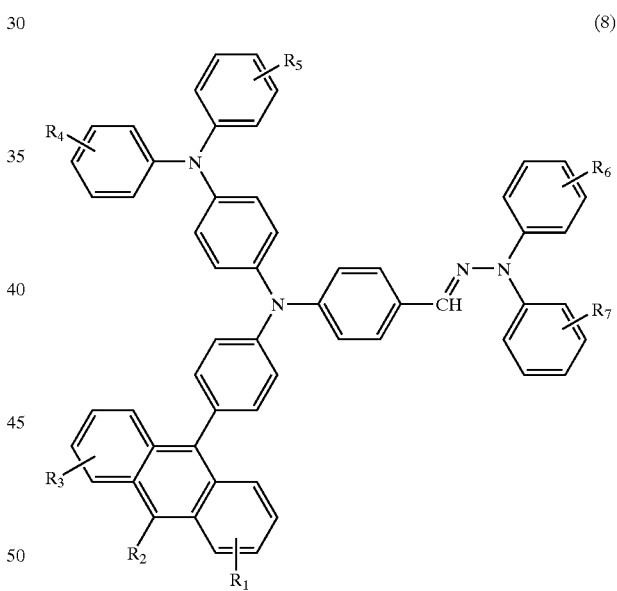

(8)

where R4, R5, R6, and R7 may be the same or different, and each independently represents a hydrogen atom, an alkyl group, or an alkoxy group; and R1, R2, and R3 may be the same or different, and each independently represents a hydrogen atom or an electron-donating substituent.

The above-mentioned hole-transport luminescent material includes an anthryl group, corresponding to the portion contributing to luminescence, and a tetraphenyl-p-phenylenediamine skeleton, corresponding to the portion contributing to hole transport, and further includes a bulky substituent, a substituted or unsubstituted 2-aza-2-diphenylaminovinyl group. Thus, a thin film EL device is obtained that achieves particularly high electroluminescent efficiency, a low operating voltage, and an extended lifetime even when the device is operated at various operating conditions.

A compound represented by the above-mentioned general formula (8) may be [4-({4-[2-aza-2-(diphenylamino)vinyl]phenyl}{4-(9-anthryl)phenyl}amino)phenyl]diphenylamine, [4-({4-[2-aza-2-(diphenylamino)vinyl]phenyl}{4-(10-methoxy(9-anthryl))phenyl}amino)phenyl]diphenylamine, or the like.

According to another aspect of the present invention the above-mentioned thin film EL device may be such that the hole-transport luminescent material is a compound represented by the following general formula (9):

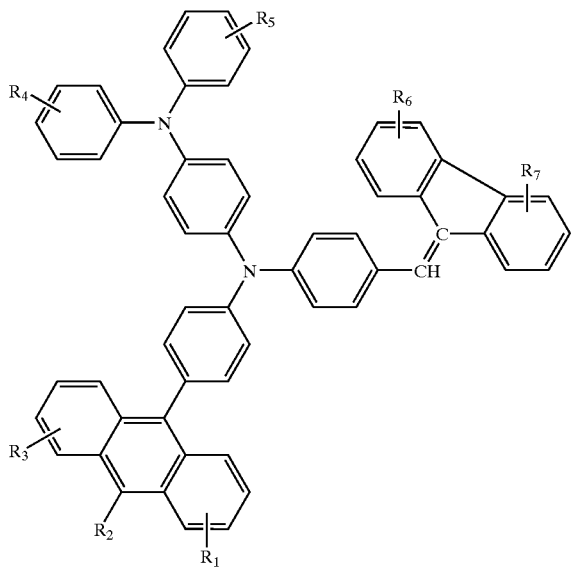

(9)

where R4, R5, R6, and R7 may be the same or different, and each independently represents a hydrogen atom, an alkyl group, or an alkoxy group; and R1, R2, and R3 may be the same or different, and each independently represents a hydrogen atom or an electron-donating substituent.

The above-mentioned hole-transport luminescent material includes an anthryl group, corresponding to the portion contributing to luminescence, and a tetraphenyl-p-phenylenediamine skeleton, corresponding to the portion contributing to hole transport, and further includes a bulky substituent, a substituted or unsubstituted fluorene-9-ylidenmethyl group. Thus, a thin film EL device is obtained that achieves particularly high electroluminescent efficiency, a low operating voltage, and an extended lifetime even when the device is operated at various operating conditions.

A compound represented by the above-mentioned general formula (9) may be (4-{[4-(fluorene-9-ylidenmethyl)phenyl][4-(9-anthryl)phenyl]amino}phenyl)diphenylamine, (4-{[4-(fluorene-9-ylidenmethyl)phenyl][4-(10-methoxy(9-anthryl))phenyl]amino }phenyl)diphenylamine, or the like.

According to another aspect of the present invention the above-mentioned thin film EL device may be such that the hole-transport luminescent material is a compound represented by the following general formula (10):

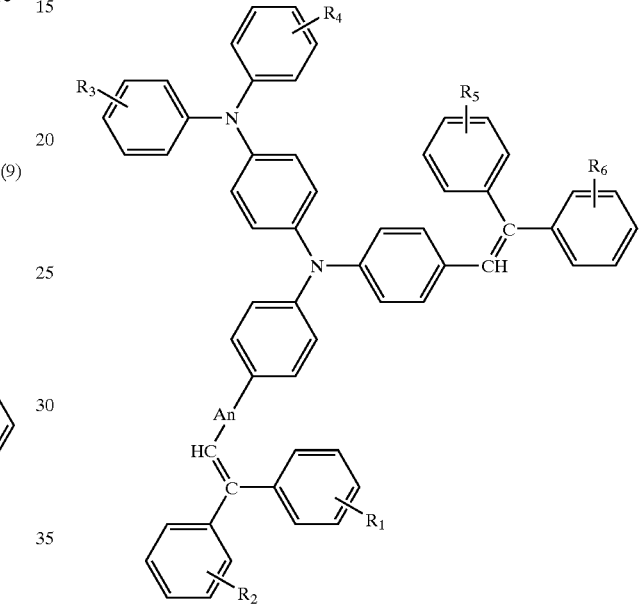

(10)

where R1, R2, R3, R4, R5, and R6 may be the same or different, and each independently represents a hydrogen atom, an alkyl group, or an alkoxy group; and An represents an arylene group composed of two or more substituted or unsubstituted fused rings.

The above-mentioned hole-transport luminescent material includes an arylene group composed of two or more fused rings, corresponding to the portion contributing to luminescence, and a tetraphenyl-p-phenylenediamine skeleton, corresponding to the portion contributing to hole transport. In addition, the material includes two bulky substitutes, substituted or unsubstituted 2,2-diphenylvinyl groups. Thus, a thin film EL device is obtained that achieves particularly high electroluminescent efficiency, a low operating voltage, and an extended lifetime even when the device is operated at various operating conditions.

A compound represented by the above-mentioned general formula (10) may be [4-({4-[10-(2,2-diphenylvinyl)(9-anthryl)]phenyl}[4-(2,2-diphenylvinyl)phenyl]amino)phenyl]diphenylamine, [4-({4-[10-(2,2-diphenylvinyl)(9-anthryl)]phenyl}{4-(2,2-diphenylvinyl)phenyl}amino)phenyl] bis(4-methoxyphenyl)amine, or the like.

According to another aspect of the present invention the above-mentioned thin film EL device may be such that the hole-transport luminescent material is a compound represented by the following general formula (11):

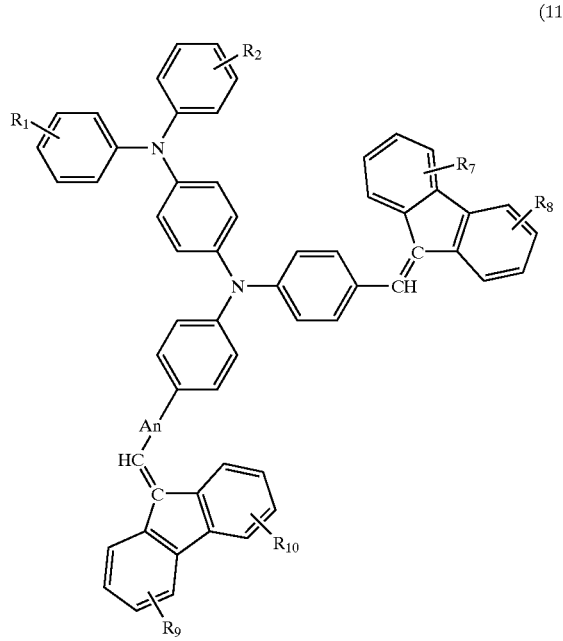

(11)

where R1, R2, R7, R8, R9, and R10 may be the same or different, and each independently represents a hydrogen atom, an alkyl group, or an alkoxy group; and An represents an arylene group composed of two or more substituted or unsubstituted fused rings.

The above-mentioned hole-transport luminescent material includes an arylene group composed of two or more fused rings, corresponding to the portion contributing to luminescence, and a tetraphenyl-p-phenylenediamine skeleton, corresponding to the portion contributing to hole transport. In addition, the material includes two bulky substitutes, substituted or unsubstituted fluorene-9-ylidenmethyl groups. Thus, a thin film EL device is obtained that achieves particularly high electroluminescent efficiency, a low operating voltage, and an extended lifetime even when the device is operated at various operating conditions.

A compound represented by the above-mentioned general formula (11) may be [4-({4-[10-(fluorene-9-ylidenmethyl)(9-anthryl)]phenyl}[4-(fluorene-9-ylidenmethyl)phenyl]amino)phenyl]diphenylamine, [4-({4-[10-(fluorene-9-ylidenmethyl)(9-anthryl)]phenyl}[4-(fluorene-9-ylidenmethyl)phenyl]amino)phenyl] bis(4-methoxyphenyl)amine, or the like.

According to another aspect of the present invention the above-mentioned thin film EL device may be such that the hole-transport luminescent material is a compound represented by the following general formula (12):

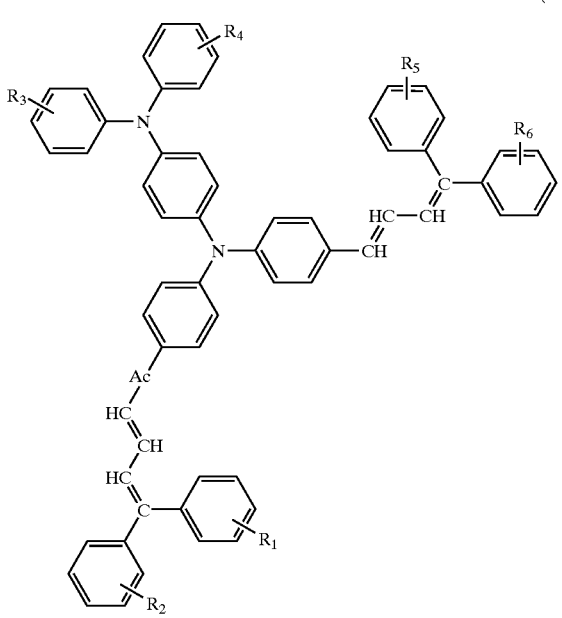

(12)

where R1 and R2 may be the same or different, and each independently represents a hydrogen atom, an alkyl group, or an alkoxy group; and An represents an arylene group composed of two or more substituted or unsubstituted fused rings.

The above-mentioned hole-transport luminescent material includes an arylene group composed of two or more fused rings, corresponding to the portion contributing to luminescence, and a tetraphenyl-p-phenylenediamine skeleton, corresponding to the portion contributing to hole transport. In addition, the hole-transport luminescent material is substituted with two bulky substitutes, substituted or unsubstituted 4,4-diphenylbuta-1,3-dienyl groups. Thus, a thin film EL device is obtained that achieves particularly high electroluminescent efficiency, a low operating voltage, and an extended lifetime even when the device is operated at various operating conditions.

A compound represented by the above-mentioned general formula (12) may be [4-({4-[10-(4,4-diphenylbuta-1,3-dienyl)(9-anthryl)]phenyl}[4-(4,4-diphenylbuta-1,3-dienyl)phenyl]amino)phenyl]diphenylamine, [4-({4-[10-(4,4-diphenylbuta-1,3-dienyl)(9-anthryl)]phenyl}{4-(4,4-diphenylbuta-1,3-dienyl)phenyl}amino)phenyl]bis(4-methoxyphenyl)amine, or the like.

According to another aspect of the present invention the above-mentioned thin film EL device may be such that the hole-transport luminescent material is a compound represented by the following general formula (13):

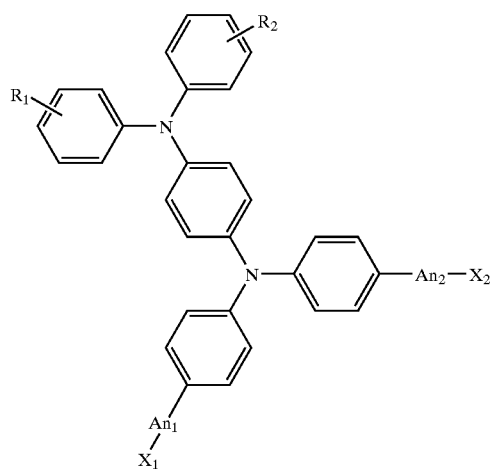

where R1 and R2 may be the same or different, and each independently represents a hydrogen atom, an alkyl group, or an alkoxy group; An1 and An2 may be the same or different, and each independently represents an arylene group composed of two or more substituted or unsubstituted fused rings; and X1 and X2 may be the same or different, and each independently represents a substituted or unsubstituted 2,2-diphenylvinyl group, 4,4-diphenylbuta-1,3-dienyl group, or fluorene-9-ylidenmethyl group or a hydrogen atom.

The above-mentioned hole-transport luminescent material includes two arylene groups composed of two or more fused rings, corresponding to the portion contributing to luminescence, and a tetraphenyl-p-phenylenediamine skeleton, corresponding to the portion contributing to hole transport. In addition, the above-mentioned arylene groups are substituted with bulky substituents. Thus, a thin film EL device is obtained that achieves particularly high electroluminescent efficiency, a low operating voltage, and an extended lifetime even when the device is operated at various operating conditions.

A compound represented by the above-mentioned general formula (13) may be {4-[bis(4-(9-anthryl)phenyl)amino]phenyl}diphenylamine, [4-(bis{4-[10-(2,2-diphenylvinyl)(9-anthryl)]phenyl}amino)phenyl]diphenylamine, [4-(bis{4-[10-(4,4-diphenylbuta-1,3-dienyl)(9-anthryl)]phenyl}amino)phenyl] diphenylamine, [4-(bis{4-[10-(fluorene-9-ylidenmethyl)(9-anthryl)]phenyl}amino)phenyl]diphenylamine, or the like.

According to another aspect of the present invention the above-mentioned thin film EL device may be such that the hole-transport luminescent material is a compound represented by the following general formula (14):

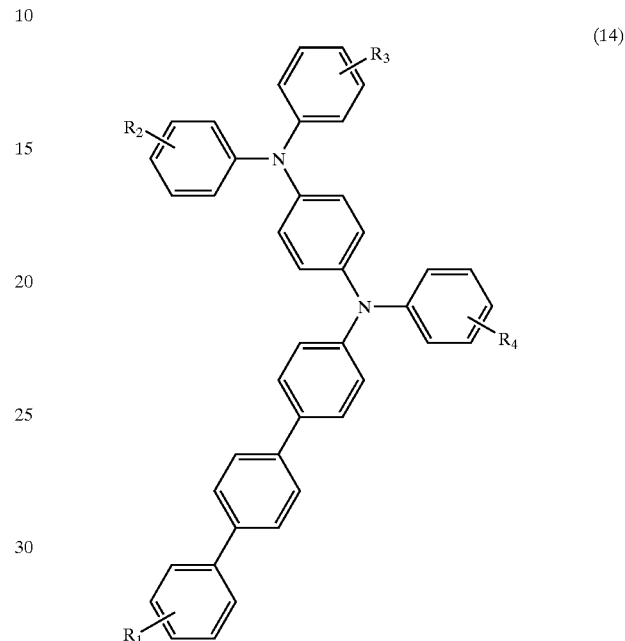

where R4 represents a hydrogen atom, an alkyl group, an alkoxy group, or an aralkyl group; and R1, R2, and R3 may be the same or different, and each independently represents a hydrogen atom, an alkyl group, or an alkoxy group.

The above-mentioned hole-transport luminescent material includes a terphenyl group, corresponding to the portion contributing to luminescence, and a tetraphenyl-p-phenylenediamine skeleton, corresponding to the portion contributing to hole transport. This material also includes a terphenyl group, which is the portion contributing to luminescence, and thus a thin film EL device is obtained that achieves high electroluminescent efficiency, a low operating voltage, and an extended lifetime even when the device is operated at various operating conditions.

A compound represented by the above-mentioned general formula (14) may be [4-(diphenylamino)phenyl][4-(4-phenylphenyl)phenyl]phenylamine, [4-{bis(4-methoxyphenyl)amino}phenyl][4-{4-(4-methoxyphenyl)phenyl}phenyl][4-(1-methyl-1-phenylethyl)phenyl]amine, or the like.

According to another aspect of the present invention the above-mentioned thin film EL device may be such that the hole-transport luminescent material is a compound represented by the following general formula (15):

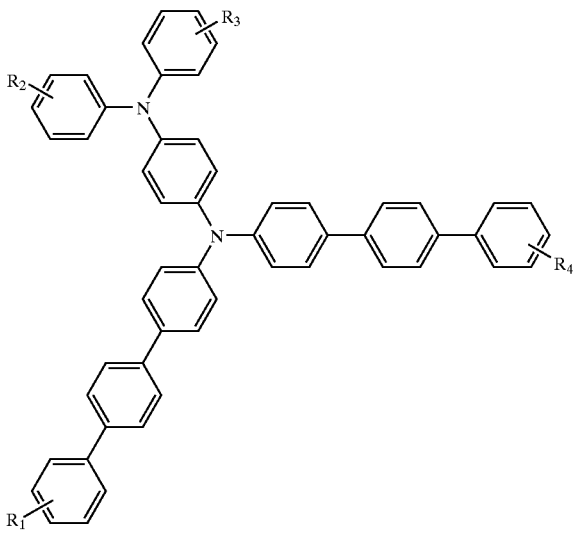

(15)

where R1, R2, R3, and R4 may be the same or different, and each independently represents a hydrogen atom, an alkyl group, or an alkoxy group.

The above-mentioned hole-transport luminescent material includes two terphenyl groups, corresponding to the portion contributing to luminescence, and a tetraphenyl-p-phenylenediamine skeleton, corresponding to the portion contributing to hole transport. This material also includes terphenyl groups, which are the portion contributing to luminescence, and thus a thin film EL device is obtained that achieves particularly high electroluminescent efficiency, a low operating voltage, and an extended lifetime even when the device is operated at various operating conditions.

A compound represented by the above-mentioned general formula (15) may be [4-(diphenylamino)phenyl][bis{4-(4-phenylphenyl)phenyl}]amine, [4-{bis(4-methoxyphenyl)amino}phenyl]bis[4-{(4-(4-methoxyphenyl)phenyl}phenyl]amine, or the like.

BEST MODE FOR CARRYING OUT THE INVENTION

Figure 1:
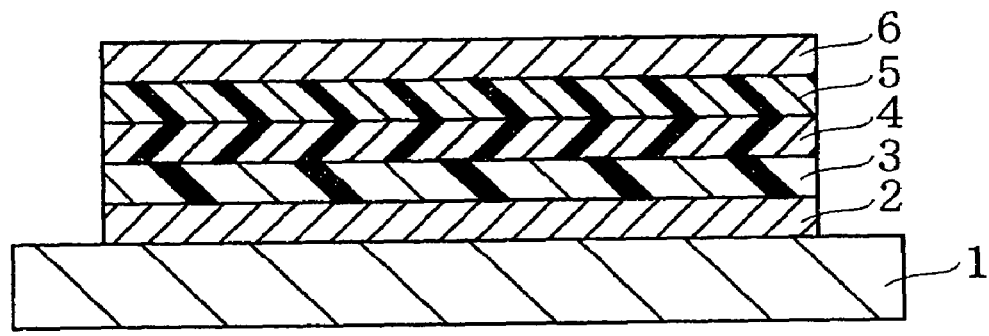
FIG. 1 is a cross sectional view schematically showing the structure of a thin film EL device according to a preferred embodiment of the present invention.

Referring now to the drawing, a thin film EL device in accordance with a preferred embodiment of the present invention will be described below. FIG. 1 is a cross sectional view schematically showing the structure of this thin film EL device.

As shown in FIG. 1, this thin film EL device comprises a hole-injecting electrode 2, an electron-injecting electrode 6 opposed to the above-mentioned hole-injecting electrode 2, and a hole-transport layer 3, a luminescent layer 4, and an electron-transport layer 5 that are sandwiched between the electrodes, on a substrate 1.

For the substrate 1, there are no particular limitations as long as it is capable of supporting the hole-injecting electrode 2 and so forth, and thus any type of substrate known in the prior art can be used. It should be noted, however, that when emitted light is extracted from the substrate side, a transparent substrate is used. For a transparent substrate, typically, a glass substrate such as Corning 1737 glass is used, but it is also possible to use a resin film such as the one made of polyester. A preferable thickness of the substrate is 0.5 to 1.0 mm thickness in terms of strength and weight.

For the hole-injecting electrode 2, there are no particular limitations as long as it functions as the anode and is capable of injecting holes into the hole-transport layer 3. It should be noted, however, that either the hole-injecting electrode 2 or the electron-injecting electrode 6 described below is made to have transparency to extract the emitted light to the outside and it is often the case that normally the hole-injecting electrode 2 is made to be a transparent electrode. In this case, an ITO (indium tin oxide) film is usually used. In forming an ITO film, in order to ensure a high degree of transparency and a low resistivity, such film-forming techniques as sputtering, electron beam evaporation, or ion plating are employed. The formed ITO film may be given various post-treatments to control its resistivity and shape. The film thickness is determined mainly from sheet resistance and visible light transmittance; however, since thin film EL devices have relatively high operating current densities, in order to reduce the sheet resistance, films are usually formed to be a thickness of 100 nm or more, generally 100 to 150 nm. In addition to an ITO film, which is a transparent electrode, it is also possible to use various improved transparent conductive layers, such as an $In_2O_3$—ZnO transparent conductive electrode (IDIXO available from Idemitsu Kosan Co., Ltd.), or a coating film of a transparent conductive coating in which conductive powder particles are dispersed.

For the electron-injecting electrode 6, an electrode that is composed of an alloy of a low work function metal with a low electron injection barrier and a relatively high work function, stable metal is used; for example, an MgAg alloy proposed by Tang et al. as described in the Background Art or an AlLi alloy. In addition, it is possible to use various structures of electrodes, such as a multi-layer cathode composed of a Li thin film and an Al film, which is thicker than the Li thin film, or a multi-layer cathode composed of a LiF film and an Al film.

The hole-transport layer 3 and the electron-transport layer 5 sandwiched between the above-mentioned hole-injecting electrode 2 and the electron-injecting electrode 6 have no particular limitations, and thus are formed using any type of material known in the prior art. For the hole-transport layer 3, a layer is used composed of a material having hole-transport properties, such as TPD or NPD described above. It is also possible to use a specific material-blended type hole-transport layer, which is disclosed in Japanese Unexamined Patent Publication No. 11-260559. For the electron-transport layer 5, a layer composed of various materials having electron-transport properties is used; for example, an aluminum quinoline complex, such as the above-mentioned tris(8-quinolinolato)aluminum (Alq3), or various compounds, such as all kinds of oxadiazole derivatives or phenanthroline derivatives, can be widely used.

Next, for the luminescent layer 4, which is the most significant feature of the present invention, the charge-transport luminescent material is used having a portion contributing to charge transport and a portion contributing to luminescence where at least two molecular orbitals (for example, HOMO and LUMO) contributing to luminescent transition are localized. The portion contributing to charge transport may be of, for example, a tetraphenyl phenylenediamine skeleton or the like. With this skeleton, generally, higher electroluminescent efficiency and longer lifetimes than triphenylamine dimer (TPD and the like), so-called Q1-G-Q2 structure, are achieved. The portion contributing to luminescence may be of, for example, an anthracene skeleton or the like. With this skeleton, particularly good electroluminescent efficiency and high charge-transport properties are achieved, and in addition low operating voltages and low power consumption are achieved.

Among the above-mentioned charge-transport luminescent materials, a material is particularly suitable in which an electron cloud of the portion contributing to charge transport and an electron cloud of the portion contributing to luminescence are localized such that the electron clouds substantially do not overlap each other. When this kind of material is used, charge transport properties and luminescent properties can be exhibited separately, and thus an excellent thin film EL device is obtained. In addition, when a carbon atom of the portion contributing to charge transport and a carbon atom of the portion contributing to luminescence are connected by a carbon-carbon bond, the electron clouds are localized individually such that the electron clouds substantially do not overlap each other, ensuring an excellent thin film EL device.

The luminescent layer 4 is formed using such charge-transport luminescent materials by various film-forming techniques such as vapor deposition. Since the luminescent layer 4 of the present invention achieves high electroluminescent efficiency, normally, it is not necessary to dope the layer with luminescent dyes. Thus, a thin film EL device suitable for mass production is obtained.

A hole-transport luminescent material may be a compound that is represented by the above-mentioned general formula (1). Above all, a compound represented by the above-mentioned general formulae (6) to (15) is preferable, and a compound represented by the general formulae (6) to (13) is more preferable.

For substituted or unsubstituted aryl groups represented by Ar1 and Ar2 in the above-mentioned formula (1), preferable examples thereof include the following: for an unsubstituted aryl group, one having 6 to 20 carbons is suitably used. Specifically, a phenyl group, a biphenyl group, a terphenyl group, a naphthyl group, an anthryl group, a phenanthryl group, a fluorenyl group, and the like, are suitable. A substituted aryl group may be one in which the above-mentioned unsubstituted aryl group is substituted with, for example, an alkyl group having 1 to 10 carbons, an alkoxy group having 1 to 10 carbons, or the like.

For a substituted or unsubstituted arylene group represented by Ar3 in Formula (1), preferable examples thereof include the following: for an unsubstituted arylene group, one having 6 to 20 carbons is suitably used. Specifically, a phenylene group, a biphenylene group, a terphenylene group, a naphthylene group, an anthrylene group, a phenanthrylene group, a fluorenylene group, and the like, are suitable. A substituted arylene group may be one in which the above-mentioned unsubstituted arylene group is substituted with, for example, an alkyl group having 1 to 10 carbons, an alkoxy group having 1 to 10 carbons, or the like. Among these aryl groups, a substituted or unsubstituted phenylene group is particularly suitable. A p-phenylene group provides an advantage which allows easy organic synthesis, and an m-phenylene group is advantageous because of its hole-transport properties and so forth.

For a substituent represented by X in Formula (1), one having 12 to 30 carbons is suitably used. Specifically, a substituent represented by the above-mentioned formula (2) is suitable.

A substituent represented by Y in Formula (1) is a substituted or unsubstituted aryl group having five or more conjugated bonds. Preferable examples thereof include the following: for an unsubstituted aryl group, an anthryl group or the like is suitably used. The number of conjugated bonds is suitably about 5 to 30. For a substituted aryl group, one in which an electron-donating substituent, such as an alkoxy group having 1 to 10 carbons, is directly bonded to an unsubstituted aryl group is suitable.

Further, for each alkyl group in the above-mentioned formulae, one having 1 to 10 carbons is suitably used. Specifically, a methyl group, an ethyl group, a propyl group, an isopropyl group, a butyl group, a s-butyl group, an isobutyl group, a t-butyl group, and the like are suitable.

For each alkoxy group in the above-mentioned formulae, one having 1 to 10 carbons is suitably used. Specifically, a methoxy group, an ethoxy group, a propoxy group, a butoxy group, a t-butoxy group, and the like are suitable.

Each electron-donating substituent in the above-mentioned formulae has no particular limitations, but an alkoxy group having 1 to 10 carbons, such as a methoxy group or an ethoxy group, is suitably used.

For each arylene group formed by the condensation of two or more substituted or unsubstituted rings in the above-mentioned formulae, preferable examples thereof include the following: for an unsubstituted arylene group, one having 10 to 20 carbons is suitably used. Specifically, a naphthylene group, an anthrylene group, a phenanthrylene group, and the like are suitable.

For each aralkyl group in the above-mentioned formulae, one having 7 to 20 carbons is suitably used. Specifically, a 1-methyl-1-phenylethyl group and the like are suitable.

Specific examples of a hole-transport luminescent material represented by the above-mentioned general formulae (6) to (15) are those described above.

(Miscellaneous)

In the foregoing, one type of a thin film EL device was explained having the hole-transport/luminescent/electron-transport layers sandwiched between the hole-injecting electrode and the electron-injecting electrode; however, the present invention is not limited to this specific type of the device. For example, an additional layer, such as a hole-injecting layer, may be provided in the device, or the hole-transport layer and/or the electron-transport layer may be omitted. For the hole-injecting layer, in order to smoothen the surface roughness of ITO, to attain low operating voltages by improving hole injecting efficiency, to extend lifetimes, and so forth, it is possible to use star-burst-amine (for example, Japanese Unexamined Patent Publication No. 3-308688), oligoamine for example, International Patent Publication No. WO96/22273), or the like.

The present invention is explained in more detail below according to the specific examples. It is to be understood, however, that the present invention is not limited to these specific examples. It should be noted that for each hole-transport luminescent material, one that is synthesized in a conventional manner and sufficiently purified was used, except where specific synthesis examples are noted.

EXAMPLE 1

First, as a substrate having a hole-injecting electrode thereon, a commercially available ITO-coated glass substrate (available from Sanyo Vacuum Industries, Co., Ltd., size: 100 mm×100 mm×t=0.7 mm, a sheet resistance of about 14 $\Omega/\square$) was used, and the substrate was patterned by photolithography such that the light-emission area is 1.4 mm×1.4 mm with the overlap of the hole-injecting electrode and an electron-injecting electrode. After the photolithography, the substrate was given a treatment as follows. The substrate was immersed in a commercially available resist stripper (a mixture of dimethyl sulfoxide and N-methyl-2-pyrrolidone) to remove the resist, then rinsed with acetone, and further immersed in fuming nitric acid for one minute to completely remove the resist. The ITO surfaces were cleaned by mechanically rubbing both (the top and bottom) surfaces of the substrate with a nylon brush as adequately supplying a 0.238% tetramethyl ammonium hydroxide solution. The surfaces were then rinsed with pure water, followed by a spin dry. Thereafter, the surfaces were given oxygen plasma treatment in a commercially available plasma reactor (Model PR41, available from Yamato Scientific Co., Ltd.) for one minute at an oxygen flow rate of 20 sccm, a pressure of 0.2 Torr (1 Torr= 133.322 Pa), and a high frequency output of 300 W.

The hole-injecting electrode-coated substrate thus prepared was placed in the vacuum chamber of a vacuum evaporator. The vacuum evaporator used here is one in which a main pumping system of a commercially available vacuum evaporator (Model EBV-6DA, available from ULVAC Japan, Ltd.) is modified. In this system, the main pumping system is a turbo molecular pump with a pumping speed of 1500 liters/min (TC1500, available from Osaka Vacuum, Ltd.) and has an ultimate vacuum of about $1\times10^{-6}$ Torr or less, and all vapor depositions were carried out in the range of 2 to $3\times10^{-6}$ Torr. In addition, all vapor depositions were carried out by connecting a tungsten boat for resistance-heated evaporation to the DC power supply (PAK10-70A, available from Kikusui Electronics Corporation).

The hole-injecting electrode-coated substrate was placed in the vacuum chamber of a system such as one described above. Onto the substrate, N,N'-bis (4'-diphenylamino-4-biphenylyl)-N,N'-diphenylbenzidine (TPT, available from Hodogaya Chemical Co., Ltd.) and 4-N,N-diphenylamino-α-phenylstilbene (PS) were co-deposited at deposition rates of 0.3 μm/s) and 0.01 (nm/s), respectively, to form a material-blended type hole-transport layer with a thickness of about 80 (nm). Then, (4-{[4-(2,2-diphenylvinyl)phenyl](4-(9-anthryl)phenyl)amino}phenyl)diphenylamine (hereafter referred to as "PPDA-PS-A"), which is a hole-transport luminescent material, was vapor deposited at a deposition rate of 0.3 nm/s to form a hole-transport luminescent layer with a thickness of about 40 nm.

Here, the PPDA-PS-A was a compound represented by the following chemical formula (16) and was obtained by synthesizing as follows.

(16)

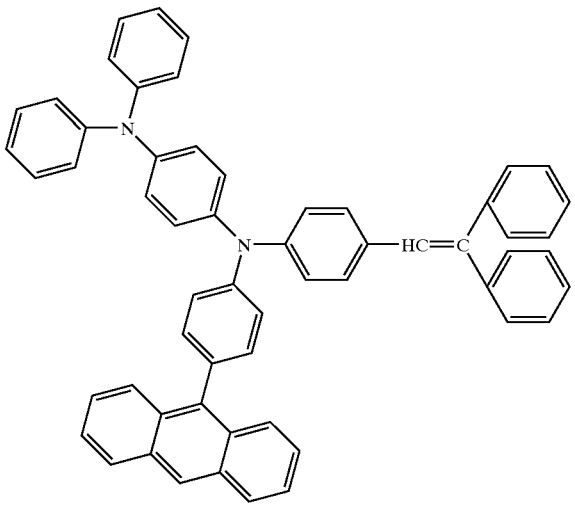

As a starting material, N-acetyl-1,4-phenylenediamine (TCI Catalog No. A0106, 2250 yen/25 g) was prepared and underwent the Ullmann reaction with iodobenzene. The resulting substance was then hydrolyzed, and further underwent the Ullmann reaction with 9-(4-iodophenyl)anthracene.

Thereafter, the resultant was formylated by the Vilsmeier reaction as shown in the following reaction formula (17). Here, for a solvent used for the reaction, it is possible to use DMF to obtain high reactivity, but in order to enhance reaction selectivity and increase the proportion of the target compound, N-methylformanilide was used. In addition, since the Vilsmeier reaction is electrophilic addition, a carbon having the highest HOMO electron density became a reactive site, and thus the para position of the benzene ring, which is directly bonded to the nitrogen, was formylated. After the formylation, the resultant was thoroughly isolated by column chromatography and thus the target compound was extracted.

(17)

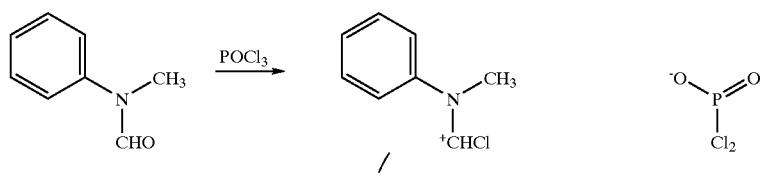

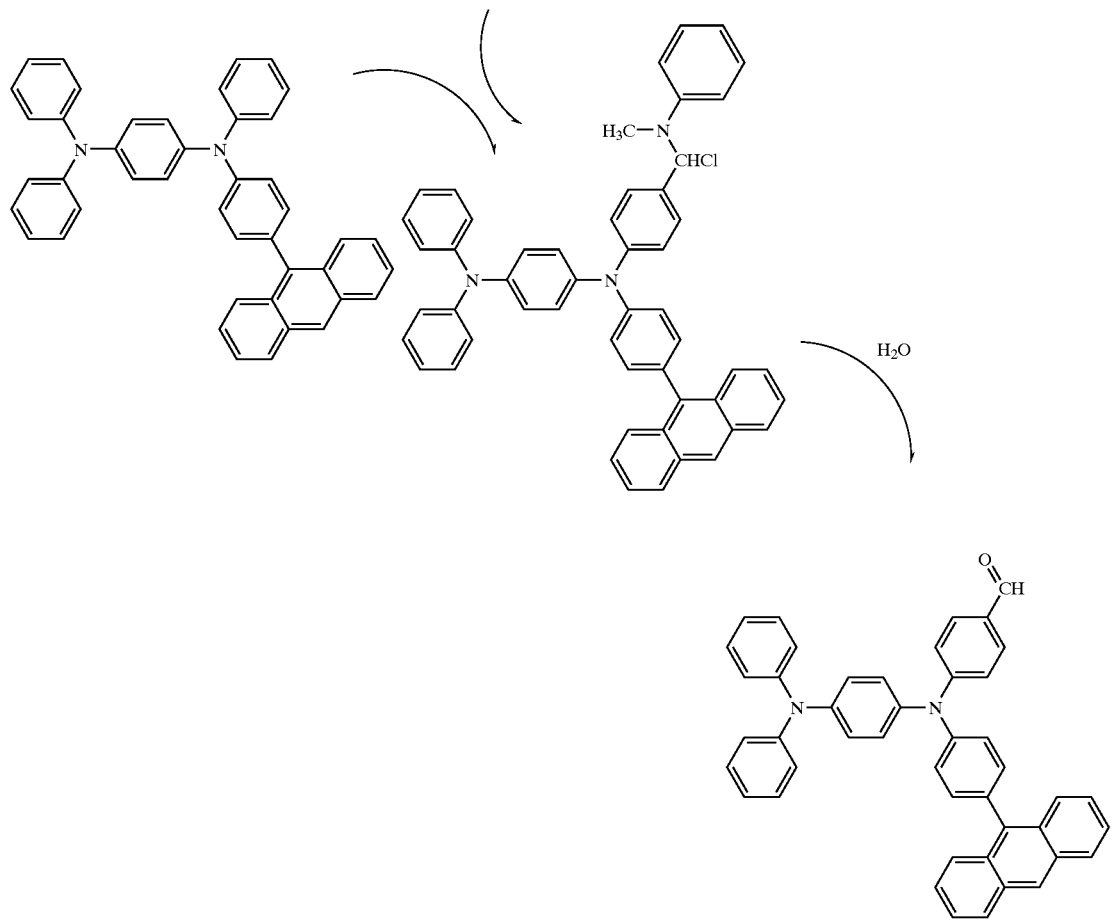

Then, diethyl diphenylmethyl phosphate, obtained from diphenylbromomethane and ethylphosphate, was distilled under reduced pressure and used in the final reaction, and then the portion formylated as described above was reacted with a diphenylvinyl group. A compound thus obtained was further isolated thoroughly by column chromatography, and then further sublimed and purified sufficiently.

It should be noted that the foregoing synthesis example shows that first, the skeleton was obtained by the Ullmann reaction, because generally a vinyl bond is thought to be not resistant to high temperature of the Ullmann reaction, and then the resultant was formylated by the Vilsmeier reaction, and finally a diphenylvinyl group was added; however, it has been confirmed that a synthesis with higher yields is achieved when the coupling of an anthracene portion is carried out rather at the end by effectively using Pd catalysts and so forth.

Next, onto the so-formed luminescent layer, tris(8-quinolinolato)aluminum (Alq3, available from Dojindo Laboratories) was vapor deposited at a deposition rate of 0.3 nm/s to form an electron-transport layer with a thickness of about 20 nm.

Then, only Li from an Al—Li alloy (available from Kojundo Chemical Laboratory Co., Ltd., the weight ratio of Al to Li is 99:1) was vapor deposited at low temperatures and at a deposition rate of about 0.1 nm/s to form an Li layer with a thickness of about 1 nm. Subsequently, the temperature of the Al—Li alloy was further increased and when Li was completely extracted, only Al was vapor deposited at a deposition rate of about 1.5 nm/s to form an Al layer with a thickness of about 100 nm. Thus, a multi-layer cathode was formed.

To the thin film EL device thus fabricated, after dry nitrogen was leaked inside the vapor deposition chamber, a Corning 7059 glass lid was attached with an adhesive (Super Back Seal 953-7000, available from Anelva Corporation) under a dry nitrogen atmosphere. Thus, a sample was obtained.

A sample of a thin film EL device thus obtained was evaluated as follows.

(Evaluation of the Device When Operated with DC Constant-Current)

In order to evaluate the electroluminescent efficiency (cd/A) and the operating voltage (V), 12 hours after the glass lid was attached to the device, the device was operated with DC constant-current under normal laboratory conditions with ambient temperature and humidity. It should be noted that the operating voltage was such a level obtained at a luminance level of 1000 (cd/m$^2$).

As for the lifetime, under the same conditions as described above, a continuous light-emission test was conducted by operating the device at a DC constant-current level that provides an initial luminance of 1000 (cd/m$^2$).

Then, the lifetime, which is defined as the time taken for luminance to decrease by half (500 cd/m$^2$), was evaluated.

Here, the device was operated with DC constant-current by using a DC constant-current power supply (Multi-Channel Current Voltage Controller TR6163, available from Advantest Corporation). The luminance was measured using a luminance meter (Topcon luminescence meter BM-8, available from Topcon Corporation).

(Evaluation of the Device When Operated with Pulsed Constant-current)

The electroluminescent efficiency (cd/A) and the operating voltage (V) were evaluated by, under the same conditions as described above, operating the device with pulsed constant-current. It should be noted that the operating voltage was such a level obtained at an average luminance of 270 (cd/m$^2$).

As for the lifetime, under the same conditions as described above, a continuous light-emission test was conducted by operating the device at a pulsed constant-current level that provides an average luminance of 270 (cd/m$^2$). Then, the lifetime, which is defined as the time taken for luminance to decrease by half (135 cd/m$^2$), was evaluated.

Here, the device was operated with pulsed constant-current by using a pulsed constant-current drive circuit. Operating conditions were such that the pulse frequency was 100 Hz (10 ms), the duty ratio was 1/240 (a pulse width of 42 μs), and the pulse waveform was a square wave. Under these operating conditions, evaluations were made by operating the device at various pulsed current levels. The luminance was measured using a luminance meter (Topcon luminescence meter BM-8, available from Topcon Corporation).

In addition to the above evaluations, the quality of luminescent images, such as uneven luminance and dark spots (non-light-emitting portions), was observed while the device was being operated to emit light by using an optical microscope with 50 times magnification.

The results of these evaluations are provided in Table 1 to be presented later.

EXAMPLE 2

A sample of the thin film EL device was fabricated in a similar manner to that described in Example 1, except that (4-{[4-(2,2-diphenylvinyl)phenyl] [4-(10-methoxy(9-anthryl))phenyl]amino}phenyl)diphenylamine (PPDA-PS-AM) was used for the formation of the hole-transport luminescent layer in place of the PPDA-PS-A. The sample was evaluated in a similar manner to that described in Example 1. The results of the evaluations are provided in Table 1 to be presented later.

EXAMPLE 3

A sample of the thin film EL device was fabricated in a similar manner to that described in Example 1, except that (4-{[4-(4,4-diphenylbuta-1,3-dienyl)phenyl](4-(9-anthryl)phenyl)amino}phenyl)diphenylamine (PPDA-PB-A) was used for the formation of the hole-transport luminescent layer in place of the PPDA-PS-A. The sample was evaluated in a similar manner to that described in Example 1. The results of the evaluations are provided in Table 1 to be presented later.

EXAMPLE 4

A sample of the thin film EL device was fabricated in a similar manner to that described in Example 1, except that (4-{[4-(4,4-diphenylbuta-1,3-dienyl)phenyl][4-(10-methoxy)(9-anthryl)]pheny}amino)phenyl)diphenylamine (PPDA-PB-AM) was used for the formation of the hole-transport luminescent layer in place of the PPDA-PS-A. The sample was evaluated in a similar manner to that described in Example 1. The results of the evaluations are provided in Table 1 to be presented later.

EXAMPLE 5

A sample of the thin film EL device was fabricated in a similar manner to that described in Example 1, except that [4-({4-[2-aza-2-(diphenylamino)vinyl]phenyl}(4-(9-anthryl)phenyl)amino)phenyl]diphenylamine (PPDA-PH-A) was used for the formation of the hole-transport luminescent layer in place of the PPDA-PS-A. The sample was evaluated in a similar manner to that described in Example 1. The results of the evaluations are provided in Table 1 to be presented later.

EXAMPLE 6

A sample of the thin film EL device was fabricated in a similar manner to that described in Example 1, except that [4-({4-[2-aza-2-(diphenylamino)vinyl]phenyl}(4-(10-methoxy(9-anthryl))phenyl)amino)phenyl] diphenylamine (PPDA-PH-AM) was used for the formation of the hole-transport luminescent layer in place of the PPDA-PS-A. The sample was evaluated in a similar manner to that described in Example 1. The results of the evaluations are provided in Table 1 to be presented later.

EXAMPLE 7

A sample of the thin film EL device was fabricated in a similar manner to that described in Example 1, except that (4-{[4-(fluorene-9-ylidenmethyl)phenyl] [4-(9-anthryl)phenyl]amino}phenyl)diphenylamine (PPDA-FM-A) was used for the formation of the hole-transport luminescent layer in place of the PPDA-PS-A. The sample was evaluated in a similar manner to that described in Example 1. The results of the evaluations are provided in Table 1 to be presented later.

EXAMPLE 8

A sample of the thin film EL device was fabricated in a similar manner, to that described in Example 1, except that (4-{[4-(fluorene-9-ylidenmethyl)phenyl] [4-(10-methoxy(9-anthryl))phenyl]amino}phenyl)diphenylamine (PPDA-FM-AM) was used for the formation of the hole-transport luminescent layer in place of the PPDA-PS-A. The sample was evaluated in a similar manner to that described in Example 1. The results of the evaluations are provided in Table 1 to be presented later.

EXAMPLE 9

A sample of the thin film EL device was fabricated in a similar manner to that described in Example 1, except that

[4-({4-[10-(2,2-diphenylvinyl)( 9-anthryl)]phenyl}[4-(2,2-diphenylvinyl)phenyl]amino)phenyl]diphenylamine (PPDA-PS-APS) was used for the formation of the hole-transport luminescent layer in place of the PPDA-PS-A. The sample was evaluated in a similar manner to that described in Example 1. The results of the evaluations are provided in Table 1 to be presented later.

EXAMPLE 10

A sample of the thin film EL device was fabricated in a similar manner to that described in Example 1, except that [4-({4-[10-(2,2-diphenylvinyl)( 9-anthryl)]phenyl}[4-(2,2-diphenylvinyl)phenyl]amino)phenyl]bis(4-methoxyphenyl)amine (M2PPDA-PS-APS) was used for the formation of the hole-transport luminescent layer in place of the PPDA-PS-A. The sample was evaluated in a similar manner to that described in Example 1. The results of the evaluations are provided in Table 1 to be presented later.

EXAMPLE 11

A sample of the thin film EL device was fabricated in a similar manner to that described in Example 1, except that 4-({4-[10-(fluorene-9-ylidenmethyl)(9-anthryl)]phenyl}[4-(fluorene-9-ylidenmethyl)phenyl]amino)phenyl]diphenylamine (PPDA-FM-AFM) was used for the formation of the hole-transport luminescent layer in place of the PPDA-PS-A. The sample was evaluated in a similar manner to that described in Example 1. The results of the evaluations are provided in Table 1 to be presented later.

EXAMPLE 12

A sample of the thin film EL device was fabricated in a similar manner to that described in Example 1, except that [4-({4-[10-(fluorene-9-ylidenmethyl)(9-anthryl)] phenyl}[4-(fluorene-9-ylidenmethyl)phenyl]amino)phenyl] bis(4-methoxyphenyl)amine (M2PPDA-FM-AFM) was used for the formation of the hole-transport luminescent layer in place of the PPDA-PS-A. The sample was evaluated in a similar manner to that described in Example 1. The results of the evaluations are provided in Table 1 to be presented later.

EXAMPLE 13

A sample of the thin film EL device was fabricated in a similar manner to that described in Example 1, except that [4-({4-[10-(4,4-diphenylbuta-1,3 -dienyl)(9-anthryl)]phenyl}[4-(4,4-diphenylbuta-1,3-dienyl)phenyl] amino)phenyl] diphenylamine (PPDA-PB-APB) was used for the formation of the hole-transport luminescent layer in place of the PPDA-PS-A. The sample was evaluated in a similar manner to that described in Example 1. The results of the evaluations are provided in Table 1 to be presented later.

EXAMPLE 14

A sample of the thin film EL device was fabricated in a similar manner to that described in Example 1, except that [4-({4-[10-(4,4-diphenylbuta-1,3-dienyl)(9-anthryl)]phenyl}[4-(4,4-diphenylbuta-1,3-dienyl)phenyl] amino)phenyl] bis(4-methoxyphenyl)amine (M2PPDA-PB-APB) was used for the formation of the hole-transport luminescent layer in place of the PPDA-PS-A. The sample was evaluated in a similar manner to that described in Example 1. The results of the evaluations are provided in Table 1 to be presented later.

EXAMPLE 15

A sample of the thin film EL device was fabricated in a similar manner to that described in Example 1, except that {4-[(bis(4-(9-anthryl)phenyl)amino] phenyl}diphenylamine (PPDA-A2) was used for the formation of the hole-transport luminescent layer in place of the PPDA-PS-A. The sample was evaluated in a similar manner to that described in Example 1. The results of the evaluations are provided in Table 1 to be presented later.

EXAMPLE 16

A sample of the thin film EL device was fabricated in a similar manner to that described in Example 1, except that [4-(bis{4-[10-(2,2-diphenylvinyl)(9-anthryl)] phenyl}amino)phenyl]diphenylamine (PPDA-APS2) was used for the formation of the hole-transport luminescent layer in place of the PPDA-PS-A. The sample was evaluated in a similar manner to that described in Example 1. The results of the evaluations are provided in Table 1 to be presented later.

EXAMPLE 17

A sample of the thin film EL device was fabricated in a similar manner to that described in Example 1, except that [4-(bis{4-[10-(4,4-diphenylbuta-1,3-dienyl)(9-anthryl)] phenyl}amino)phenyl]diphenylamine (PPDA-APB2) was used for the formation of the hole-transport luminescent layer in place of the PPDA-PS-A. The sample was evaluated in a similar manner to that described in Example 1. The results of the evaluations are provided in Table 1 to be presented later.

EXAMPLE 18

A sample of the thin film EL device was fabricated in a similar manner to that described in Example 1, except that [4-(bis{4-[10-(fluorene-9-ylidenmethyl)(9-anthryl)] phenyl}amino)phenyl]diphenylamine (PPDA-AFM 2) was used for the formation of the hole-transport luminescent layer in place of the PPDA-PS-A. The sample was evaluated in a similar manner to that described in Example 1. The results of the evaluations are provided in Table 1 to be presented later.

EXAMPLE 19

A sample of the thin film EL device was fabricated in a similar manner to that described in Example 1, except that [4-(diphenylamino)phenyl][4-(4-phenylphenyl)phenyl]phenylamine (TPPDA) was used for the formation of the hole-transport luminescent layer in place of the PPDA-PS-A. The sample was evaluated in a similar manner to that described in Example 1. The results of the evaluations are provided in Table 1 to be presented later.

EXAMPLE 20

A sample of the thin film EL device was fabricated in a similar manner to that described in Example 1, except that [4-{bis(4-methoxyphenyl)amino}phenyl][4-{4-(4-methoxyphenyl)phenyl}phenyl][4-(1-methyl-1-phenylethyl)phenyl] amine (MTPPDA) was used for the formation of the hole-transport luminescent layer in place of the PPDA-PS-A. The sample was evaluated in a similar manner to that described in Example 1. The results of the evaluations are provided in Table 1 to be presented later.

EXAMPLE 21

A sample of the thin film EL device was fabricated in a similar manner to that described in Example 1, except that [4-(diphenylamino)phenyl][bis{4-(4-phenylphenyl)phenyl}]amine (T2PPDA) was used for the formation of the hole-transport luminescent layer in place of the PPDA-PS-A The sample was evaluated in a similar manner to that described in Example 1. The results of the evaluations are provided in Table 1 to be presented later.

EXAMPLE 22

A sample of the thin film EL device was fabricated in a similar manner to that described in Example 1, except that [4-{bis(4-methoxyphenyl)amino}phenyl]bis[4-{4-(4-methoxyphenyl)phenyl}phenyl]amine (MT2PPDA) was used for the formation of the hole-transport luminescent layer in place of the PPDA-PS-A. The sample was evaluated in a similar manner to that described in Example 1. The results of the evaluations are provided in Table 1 to be presented later.

Comparative Example 1

A sample of the thin film EL device was fabricated in a similar manner to that described in Example 1, except that [4-{2-(naphthalene-1-yl)vinyl}phenyl]bis(4-methoxyphenyl)amine (DANS) was used for the formation of the hole-transport luminescent layer in place of the PPDA-PS-A. The sample was evaluated in a similar manner to that described in Example 1. The results of the evaluations are provided in Table 1 to be presented later.

Comparative Example 2

A sample of the thin film EL device was fabricated in a similar manner to that described in Example 1, except that [4-(2,2-diphenylvinyl)phenyl]bis(4-methoxyphenyl)amine (MDAPS) was used for the formation of the hole-transport luminescent layer in place of the PPDA-PS-A. The sample was evaluated in a similar manner to that described in Example 1. The results of the evaluations are provided in Table 1 to be presented later.

Comparative Example 3

A sample of the thin film EL device was fabricated in a similar manner to that described in Example 1, except that 4,4'-bis(2,2-diphenyl-1-vinyl)-1,1'-biphenyl (DPVBi) was used for the formation of the hole-transport luminescent layer in place of the PPDA-PS-A. The sample was evaluated in a similar manner to that described in Example 1. The results of the evaluations are provided in Table 1 to be presented later.

Comparative Example 4

A sample of the thin film EL device was fabricated in a similar manner to that described in Example 1, except that instead of forming a 40-nm-thick layer of the PPDA-PS-A, which is a hole-transport luminescent material, N,N'-bis(3-methylphenyl)-N,N'-diphenylbenzidine (TPD) was vapor deposited at a deposition rate of 0.3 (nm/s) to form a film having a thickness of 30 nm, which serves as the hole-transport luminescent layer, and then bathocuproine (BCP, available from Sigma-Aldrich Corporation) was vapor deposited at a deposition rate of 0.3 (nm/s) to form a film having a thickness of 5 nm. The sample was evaluated in a similar manner to that described in Example 1. The results of the evaluations are provided in Table 1 to be presented later.

Comparative Example 5

A sample of the thin film EL device was fabricated in a similar manner to that described in Example 1, except that instead of forming a 40-nm-thick layer of the PPDA-PS-A, which is a hole-transport luminescent material, N,N'-bis(α-naphthyl)-N,N'-diphenylbenzidine (NPD) was vapor deposited at a deposition rate of 0.3 (nm/s) to form a film having a thickness of 30 nm, which serves as the hole-transport luminescent layer, and then bathocuproine (BCP, available from Sigma-Aldrich Corporation) was vapor deposited at a deposition rate of 0.3 (nm/s) to form a film having a thickness of 5 nm. The sample was evaluated in a similar manner to that described in Example 1. The results of the evaluations are provided in Table 1 to be presented later.

Comparative Example 6

A sample of the thin film EL device was fabricated in a similar manner to that described in Example 1, except that [4-(diphenylamino)phenyl] diphenylamine (TPPDA) was used for the formation of the hole-transport luminescent layer in place of the PPDA-PS-A. The sample was evaluated in a similar manner to that described in Example 1. The results of the evaluations are provided in Table 1 to be presented later.

Comparative Example 7

A sample of the thin film EL device was fabricated in a similar manner to that described in Example 1, except that [4-{(4-phenylphenyl)phenylamino}phenyl](4-phenylphenyl)phenylamine (DPBBPDA) was used for the formation of the hole-transport luminescent layer in place of the PPDA-PS-A. The sample was evaluated in a similar manner to that described in Example 1. The results of the evaluations are provided in Table 1 to be presented later.

Comparative Example 8

A sample of the thin film EL device was fabricated in a similar manner to that described in Example 1, except that [4-{bis(4-phenylphenyl)amino}phenyl]bis(4-phenylphenyl)amine (TBPDA) was used for the formation of the hole-transport luminescent layer in place of the PPDA-PS-A. The sample was evaluated in a similar manner to that described in Example 1. The results of the evaluations are provided in Table 1 to be presented later.

TABLE 1

| | | Evaluation Result | | | | | | |
|---|---|---|---|---|---|---|---|---|
| | | DC Constant-Current Operation | | | Pulsed Constant-Current Operation | | | |
| | Sample | EL Efficiency | Driving | Life* | EL Efficiency | Driving | Life* | |
| Example | Component | (cd/A) | Voltage (V) | (hrs) | (cd/A) | Voltage (V) | (hrs) | Others** |
| 1 | ITO/TPT + PS(80)/PPDA-PS-A(40)/Alq3(20)/Li/Al | 15.4 | 6.1 | 3100 | 15.1 | 8.2 | 2500 | Good |
| 2 | ITO/TPT + PS(80)/PPDA-PS-AM(40)/Alq3(20)/Li/Al | 16.7 | 5.9 | 3300 | 16.3 | 8.0 | 2600 | Good |
| 3 | ITO/TPT + PS(80)/PPDA-PB-A(40)/Alq3(20)/Li/Al | 15.9 | 5.8 | 2900 | 15.6 | 7.8 | 2400 | Good |
| 4 | ITO/TPT + PS(80)/PPDA-PB-AM(40)/Alq3(20)/Li/Al | 17.1 | 5.8 | 3000 | 16.7 | 7.7 | 2500 | Good |
| 5 | ITO/TPT + PS(80)/PPDA-PH-A(40)/Alq3(20)/Li/Al | 15.5 | 5.7 | 2800 | 14.9 | 7.8 | 2300 | Good |
| 6 | ITO/TPT + PS(80)/PPDA-PH-AM(40)/Alq3(20)/Li/Al | 16.4 | 5.9 | 2900 | 16.0 | 7.9 | 2400 | Good |
| 7 | ITO/TPT + PS(80)/PPDA-FM-A(40)/Alq3(20)/Li/Al | 16.1 | 5.6 | 3300 | 15.7 | 7.7 | 2600 | Good |
| 8 | ITO/TPT + PS(80)/PPDA-FM-AM(40)/Alq3(20)/Li/Al | 17.2 | 5.5 | 3500 | 16.5 | 7.4 | 2800 | Good |
| 9 | ITO/TPT + PS(80)/PPDA-PS-APS(40)/Alq3(20)/Li/Al | 18.8 | 4.9 | 3300 | 18.3 | 6.9 | 2700 | Good |
| 10 | ITO/TPT + PS(80)/M2PPDA-PS-APS(40)/Alq3(20)/Li/Al | 18.6 | 5.0 | 3500 | 18.1 | 7.0 | 2900 | Good |
| 11 | ITO/TPT + PS(80)/PPDA-FM-AFM(40)/Alq3(20)/Li/Al | 17.9 | 5.0 | 3600 | 17.2 | 7.2 | 3000 | Good |
| 12 | ITO/TPT + PS(80)/M2PPDA-FM-AFM(40)/Alq3(20)/Li/Al | 18.0 | 4.8 | 3700 | 17.2 | 6.7 | 3200 | Good |
| 13 | ITO/TPT + PS(80)/PPDA-PB-APB(40)/Alq3(20)/Li/Al | 19.0 | 4.9 | 3200 | 18.0 | 6.9 | 2500 | Good |
| 14 | ITO/TPT + PS(80)/M2PPDA-PB-APB(40)/Alg3(20)/Li/Al | 19.2 | 5.1 | 3400 | 18.6 | 7.0 | 2800 | Good |
| 15 | ITO/TPT + PS(80)/PPDA-A2(40)/Alq3(20)/Li/Al | 17.9 | 5.1 | 3500 | 17.1 | 7.2 | 2900 | Good |
| 16 | ITO/TPT + PS(80)/PPDA-APS2(40)/Alq3(20)/Li/Al | 20.2 | 4.9 | 3800 | 20.0 | 6.7 | 3300 | Good |
| 17 | ITO/TPT + PS(80)/PPDA-APB2(40)/Alq3(20)/Li/Al | 20.1 | 4.9 | 3600 | 19.3 | 6.8 | 3000 | Good |
| 18 | ITO/TPT + PS(80)/PPDA-AFM2(40)/Alq3(20)/Li/Al | 19.8 | 4.7 | 4000 | 18.9 | 6.6 | 3100 | Good |
| 19 | ITO/TPT + PS(80)/TPPDA(40)/Alq3(20)/Li/Al | 9.1 | 7.1 | 1900 | 8.3 | 9.2 | 1600 | Good |
| 20 | ITO/TPT + PS(80)/MTPPDA(40)/Alq3(20)/Li/Al | 10.0 | 7.2 | 2200 | 9.7 | 9.2 | 1800 | Good |
| 21 | ITO/TPT + PS(80)/T2PPDA(40)/Alq3(20)/Li/Al | 7.7 | 7.6 | 1600 | 7.5 | 9.4 | 1300 | Good |
| 22 | ITO/TPT + PS(80)/MT2PPDA(40)/Alq3(20)/Li/Al | 8.6 | 7.7 | 1800 | 8.3 | 9.6 | 1400 | Good |
| C1 | ITO/TPT + PS(80)/DANS(40)/Alq3(20)/Li/Al | 1.5 | 9.8 | 170 | 0.9 | 13.8 | 90 | Good |
| C2 | ITO/TPT + PS(80)/MDAPS(40)/Alq3(20)/Li/Al | 1.8 | 9.6 | 110 | 1.2 | 12.6 | 50 | Good |
| C3 | ITO/TPT + PS(80)/DPVBi(40)/Alq3(20)/Li/Al | 3.1 | 8.9 | 300 | 2.3 | 12.3 | 190 | Good |
| C4 | ITO/TPT + PS(80)/TPD(30)/BCP(5)/Alq3(20)/Li/Al | 2.1 | 10.2 | 180 | 1.7 | 15.2 | 80 | Good |
| C5 | ITO/TPT + PS(80)/NPD(80)/BCP(5)/Alq3(20)/Li/Al | 1.8 | 10.7 | 280 | 1.5 | 15.7 | 120 | Good |
| C6 | ITO/TPT + PS(80)/TPPDA(40)/Alq3(20)/Li/Al | 1.7 | 9.7 | 130 | 1.1 | 13.7 | 70 | Good |
| C7 | ITO/TPT + PS(80)/DPBBPDA(40)/Alq3(20)/Li/Al | 4.0 | 9.2 | 280 | 2.8 | 13.2 | 90 | Good |
| C8 | ITO/TPT + PS(80)/TBPDA(40)/Alq3(20)/Li/Al | 3.6 | 9.4 | 350 | 3.2 | 13.4 | 110 | Good |

C = Comparative
EL = Electroluminescent
*Life to half luminance
**includes uneven luminance, etc.

The results in Table 1 show that according to Examples 1 to 22, the devices have high electroluminescent efficiency and achieve luminescence with good visibility with low operating voltages and self-emission. In addition, the continuous light-emission tests revealed that the devices showed little degradation in luminance, had no defects such as dark spots or uneven luminance, and were capable of operating stably over an extremely long period of time.

Particularly, even in pulsed-operation corresponding to the actual panel operation, the devices have high electroluminescent efficiency and low operating voltages. In addition, the continuous light-emission tests revealed that the devices showed little degradation in luminance, had no defects such as dark spots or uneven luminance, and were capable of operating stably over an extremely long period of time.

Further, the devices of Examples 1 to 18 achieve higher electroluminescent efficiency, lower operating voltages, and longer lifetimes as compared to those of Examples 19 to 22. This may be explained by the fact that in the devices of Example 1 to 18 the electron clouds of the portions contributing to hole transport and the electron clouds of the portions contributing to luminescence are localized such that the electron clouds substantially do not overlap each other.

In Table 1 above, the constituent compounds of the devices of each example and comparative example are represented in an abbreviated form as follows:
TPT indicates N,N'-bis(4'-diphenylamino-4-biphenylyl)-N, N'-diphenylbenzidine;
PS indicates 4-N,N-diphenylamino-α-phenylstilbene;
The PPDA-PS-A indicates (4-{[4-(2,2-diphenylvinyl)phenyl](4-(9-anthryl)phenyl)amino}phenyl)diphenylamine;
PPDA-PS-AM indicates (4-{[4-(2,2-diphenylvinyl)phenyl][4-(10-methoxy(9-anthryl))phenyl]amino}phenyl)diphenylamine;
PPDA-PB-A indicates (4-{[4-(4,4-diphenylbuta-1,3-dienyl)phenyl](4-(9-anthryl)phenyl)amino}phenyl)diphenylamine;
PPDA-PB-AM indicates (4-{[4-(4,4-diphenylbuta-1,3-dienyl)phenyl][4-(10-methoxy)(9-anthryl)]phenyl}amino)phenyl)diphenylamine;
PPDA-PH-A indicates [4-({4-[2-aza-2-(diphenylamino)vinyl]phenyl}(4-(9-anthryl)phenyl)amino)phenyl]diphenylamine;
PPDA-PH-AM indicates [4-({4-[2-aza-2-(diphenylamino)vinyl]phenyl}(4-(10-methoxy(9-anthryl))phenyl)amino)phenyl]diphenylaminine;
PPDA-FM-A indicates (4-{[4-(fluorene-9-ylidenemethyl)phenyl][4-(9-anthryl)phenyl]amino}phenyl)diphenylamine;
PPDA-FM-AM indicates (4-{[4-(fluorene-9-ylidenemethyl)phenyl][4-(10-methoxy(9-anthryl))phenyl]amino}phenyl)diphenylamine;
PPDA-PS-APS indicates [4-({4-[10-(2,2-diphenylvinyl)(9-anthryl)]phenyl}[4-(2,2-diphenylvinyl)phenyl]amino)phenyl]diphenylamine;

M2PPDA-PS-APS indicates [4-({4-[10-(2,2-diphenylvinyl)(9-anthryl)]phenyl}[4-(2,2-diphenylvinyl)phenyl]amino)phenyl]bis(4-methoxyphenyl)amine;

PPDA-FM-AFM indicates [4-({4-[10-(fluorene-9-ylidenemethyl)(9-anthryl)]phenyl}[4-(fluorene-9-ylidenemethyl)phenyl]amino)phenyl]diphenylamine;

M2PPDA-FM-AFM indicates [4-({4-[10-(fluorene-9-ylidenemethyl)(9-anthryl)]phenyl}[4-(fluorene-9-ylidenemethyl)phenyl]amino)phenyl]bis(4-methoxyphenyl)amine;

PPDA-PB-APB indicates [4-({4-[10-(4,4-diphenylbuta-1,3-dienyl)(9-anthryl)]phenyl}[4-(4,4-diphenylbuta-1,3-dienylphenyl]amino)phenyl] diphenylamine;

M2PPDA-PB-APB indicates [4-({4-[10-(4,4-diphenylbuta-1,3-dienyl)(9-anthryl)]phenyl}[4-(4,4-diphenylbuta-1,3-dienyl)phenyl]amino)phenyl]bis(4-methoxyphenyl)amine;

PPDA-A2 indicates {4-[bis(4-(9-anthryl)phenyl)amino]phenyl}diphenylamine;

PPDA-APS2 indicates [4-(bis{4-[10-(2,2-diphenylvinyl)(9-anthryl)]phenyl}amino)phenyl]diphenylamine;

PPDA-APB2 indicates [4-(bis{4-[10-(4,4-diphenylbuta-1,3-dienyl)(9-anthryl)]phenyl}amino)phenyl]diphenylamine;

PPDA-AFM2 indicates [4-(bis{4-[10-(fluorene-9-ylidenemethyl)(9-anthryl)]phenyl}amino)phenyl]diphenylamine;

TPPDA indicates [4-(diphenylamino)phenyl][4-(4-phenylphenyl)phenyl] phenylamine;

MTPPDA indicates [4-{bis(4-mthoxyphenyl)amino}phenyl][4-{4-(4-methoxyphenyl)phenyl}phenyl][4-(1-methyl-1-phenylethyl)phenyl]amine;

T2PPDA indicates [4-(diphenylamino)phenyl][bis{4-(4-phenylphenyl)phenyl}]amine;

MT2PPDA indicates [4-{bis(4-methoxyphenyl)amino}phenyl]bis[4-{4-(4-methoxyphenyl)phenyl}phenyl]amine;

DANS indicates [4-{2-(naphthalene-1-yl)vinyl}phenyl]bis(4-methoxyphenyl)amine;

MDAPS indicates [4-(2,2-diphenylvinyl)phenyl]bis(4-methoxyphenyl)amine;

DPVBi indicates 4,4'-bis(2,2-diphenyl-1-vinyl)-1,1'-biphenyl;

TPD indicates N,N'-bis(3-methylphenyl)-N,N'-diphenylbenzidine;

BCP indicates 2,9-dimethyl-4,7-diphenyl-1,10-phenanthroline (bathocuproine);

NPD indicates N,N'-bis(α-naphthyl)-N,N'-diphenylbenzidine;

TPPDA indicates [4-(diphenylamino)phenyl]diphenylamine;

DPBBPDA indicates [4-{(4-phenylphenyl)phenylamino}-phenyl](4-phenylphenyl)phenylamine;

TBPDA indicates [4-{bis(4-phenylphenyl)amino}phenyl]bis(4-phenylphenyl)amine;

Alq3 indicates tris(8-quinolinolato)aluminum;

Al indicates aluminum; and

Li indicates lithium.

The laminate structures are described in sequence from the ITO electrode side using the abbreviations with a slash (/) separating the layers. The numbers in parentheses indicate the layer thicknesses in nanometers, and the plus sign (+) indicates a layer in which two components coexist such as a doped mixture.

For reference, the absorption wavelengths and oscillator strengths of compounds represented by the following chemical formulae (18) and (19) corresponding to a hole-transport luminescent material of the present invention and a compound represented by the following chemical formula (20) that does not correspond to a hole-transport luminescent material of the present invention are provided in Table 2 to be presented later.

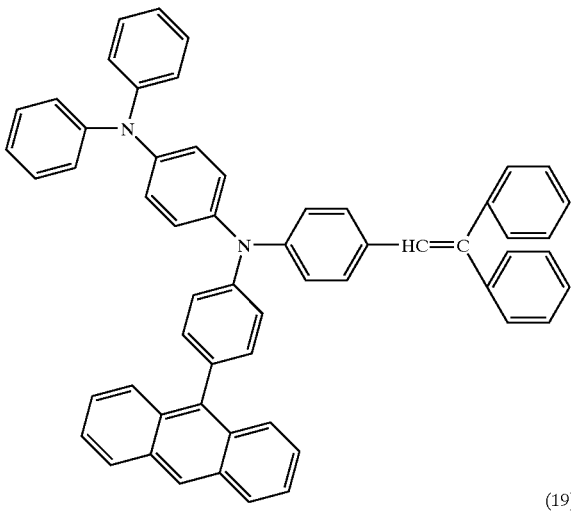

(18)

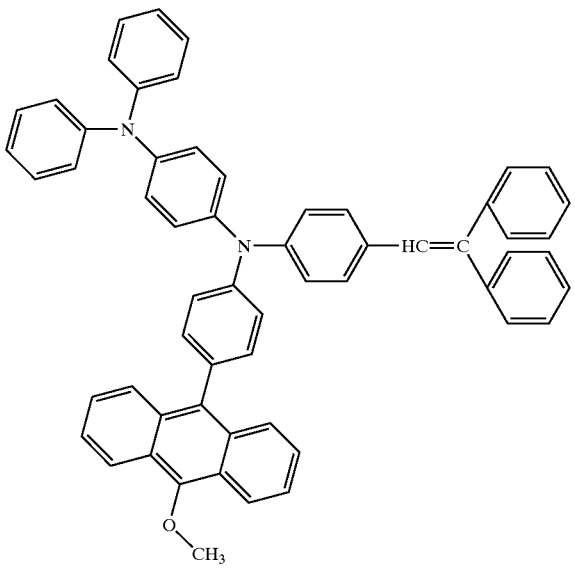

(19)

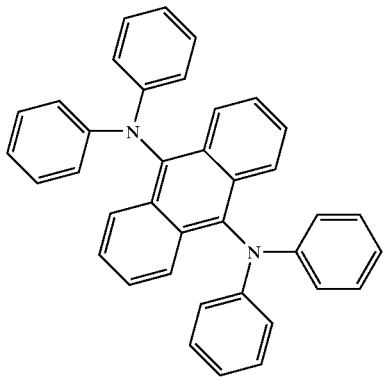

(20)

TABLE 2

|  | Absorption Wavelength (nm) | Oscillator Strength |
|---|---|---|
| Chemical Formula (18) | 343.1 | 0.466 |
| Chemical Formula (19) | 383.3 | 0.836 |
| Chemical Formula (20) | 376.8 | 0.390 |

Table 2 shows that the compounds represented by the above-mentioned chemical formulae (18) and (19) have higher oscillator strengths than the compound represented by the chemical formula (20). The oscillator strength and the electroluminescent efficiency are correlated, that is to say, when the oscillator strength is high, the electroluminescent efficiency is high. Thus, a device using the compound represented by the chemical formula (18) or (19) as the luminescent material achieves high electroluminescent efficiency.

In addition, the compound represented by the chemical formula (19) has higher oscillator strength than the compound represented by the chemical formula (18). The compound represented by the chemical formula (19) is one in which a methoxy group (an electron-donating substituent) is directly bonded to an anthracene skeleton (a portion contributing to luminescence) of the compound represented by the chemical formula (18). Consequently, a device using a compound, in which an electron-donating substituent is directly bonded to a portion contributing to luminescence, achieves higher electroluminescent efficiency.

Industrial Applicability

As has been described thus far, according to the present invention, a thin film EL device uses, as the charge-transport luminescent material, a compound represented by the above-mentioned general formula (1) that has a portion contributing to charge transport and a portion contributing to luminescence where at least two molecular orbitals contributing to luminescent transition are localized. Thus, it is possible to provide self-luminous devices with excellent visibility that exhibit high electroluminescent efficiency, low operating voltages, and longer lifetimes even when operated at various operating voltages. In addition, the continuous light-emission tests revealed that the devices showed little degradation in luminance and were capable of operating stably with low power consumption over an extremely long period of time.

Furthermore, even in pulsed operation corresponding to the actual operation of the passive matrix panel, the devices have low operating voltages, high efficiency, and high reliability and are capable of operating stably with low power consumption over an extremely long period of time.

Thus, the present invention is useful in fields such as various kinds of light sources used for self-luminous flat panel displays, telecommunications, lighting, and other applications.

What is claimed is:

1. A thin film EL device comprising at least:
   a hole-injecting electrode;
   an electron-injecting electrode opposed to said hole-injecting electrode; and
   a luminescent layer sandwiched between said hole-injecting electrode and said electron-injecting electrode, said luminescent layer containing a compound represented by the following general formula (1):

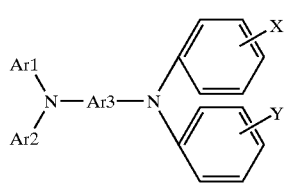

(1)

where Ar1 and Ar2 are the same or different, and each independently represents a substituted or unsubstituted aryl group; Ar3 represents a phenylene group; X represents a group of the following general formula (2):

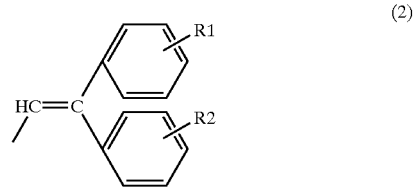

(2)

where $R^1$ and $R^2$ are the same or different, and each independently represents a hydrogen atom or an alkyl group; and Y represents a substituted aryl group having an electron-donating substituent that, prior to substitution with the electron-donating substituent, has five or more conjugated bonds.

2. A thin film EL device according to claim 1, wherein Ar3 represents a p-phenylene group.

3. A thin film EL device according to claim 1, wherein Ar3 represents a m-phenylene group.

4. A thin film EL device comprising at least:
   a hole-injecting electrode;
   an electron-injecting electrode opposed to said hole-injecting electrode; and
   a luminescent layer sandwiched between said hole-injecting electrode and said electron-injecting electrode, said luminescent layer containing a compound represented by the following general formula (6):

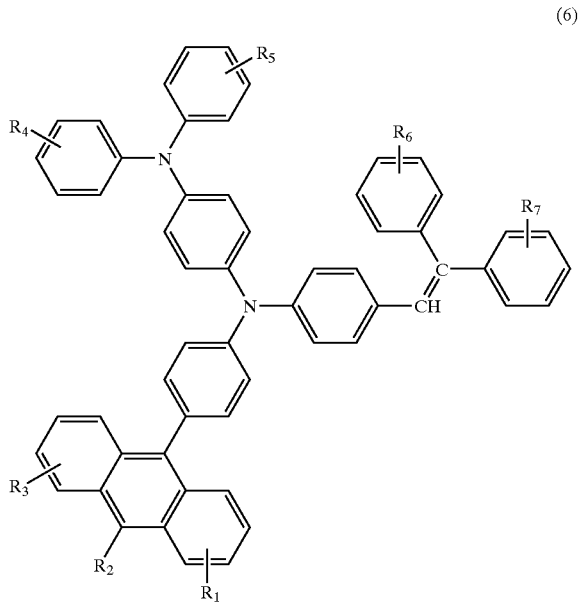

(6)

where R4, R5, R6, and R7 may be the same or different, and each independently represents a hydrogen atom, an alkyl group, or an alkoxy group; and R1, R2, and R3 may be the same or different, and each independently represents a hydrogen atom or an electron-donating substituent.

5. A thin film EL device according to claim 4, wherein said compound represented by the general formula (6) is (4-{[4-(2,2-diphenylvinyl)phenyl] [4-(9-anthryl)phenyl]amino}phenyl)diphenylamine.

6. A thin film EL device according to claim 4, wherein said compound represented by the general formula (6) is (4-{[4-(2,2-diphenylvinyl)phenyl][4-(10-methoxy(9-anthryl))phenyl]amino}phenyl)diphenylamine.

7. A thin film EL device comprising at least:
a hole-injecting electrode;
an electron-injecting electrode opposed to said hole-injecting electrode; and
a luminescent layer sandwiched between said hole-injecting electrode and said electron-injecting electrode, said luminescent layer containing a compound represented by the following general formula (7):

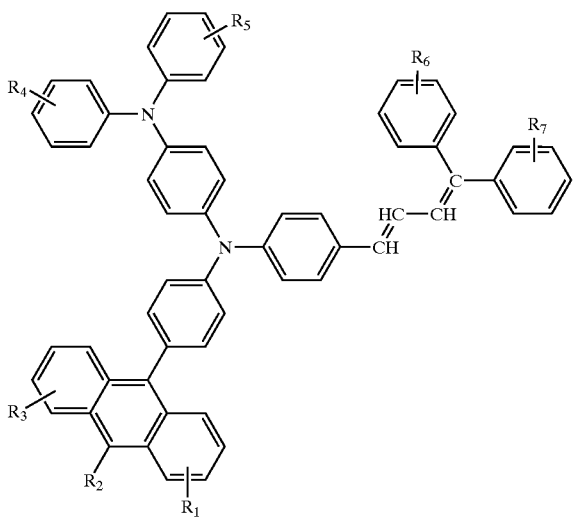

(7)

where R4, R5, R6, and R7 may be the same or different, and each independently represents a hydrogen atom, an alkyl group, or an alkoxy group; and R1, R2, and R3 may be the same or different, and each independently represents a hydrogen atom or an electron-donating substituent.

8. A thin film EL device according to claim 7, wherein said compound represented by the general formula (7) is (4-{[4-(4,4-diphenylbuta-1,3-dienyl)phenyl] [4-(9-anthryl)phenyl]amino}phenyl)diphenylamine.

9. A thin film EL device according to claim 7, wherein said compound represented by the general formula (7) is (4-{[4-(4,4-diphenylbuta-1,3-dienyl)phenyl] [4-(10-methoxy(9-anthryl))phenyl]amino}phenyl)diphenylamine.

10. A thin film EL device comprising at least:
a hole-injecting electrode;
an electron-injecting electrode opposed to said hole-injecting electrode; and
a luminescent layer sandwiched between said hole-injecting electrode and said electron-injecting electrode, said luminescent layer containing a compound represented by the following general formula (8):

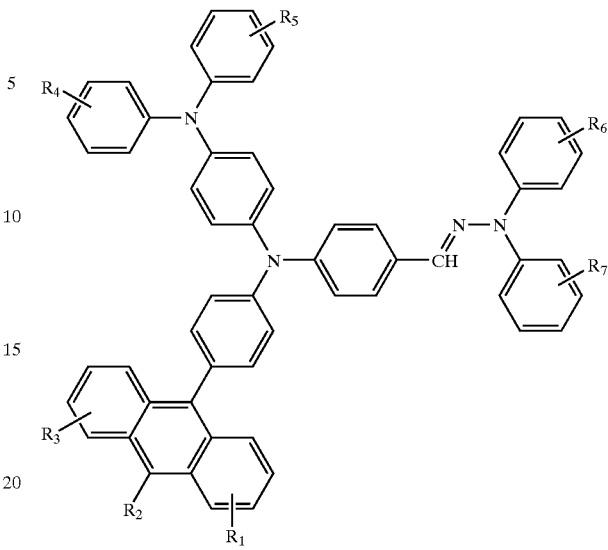

(8)

where R4, R5, R6, and R7 may be the same or different, and each independently represents a hydrogen atom, an alkyl group, or an alkoxy group; and R1, R2, and R3 may be the same or different, and each independently represents a hydrogen atom or an electron-donating substituent.

11. A thin film EL device according to claim 10, wherein said compound represented by the general formula (8) is [4-({4-[2-aza-2-(diphenylamino)vinyl]phenyl}{4-(9-anthryl)phenyl}amino)phenyl]diphenylamine.

12. A thin film EL device according to claim 10, wherein said compound represented by the general formula (8) is [4-({4-[2-aza-2-(diphenylamino)vinyl]phenyl}{4-(10-methoxy(9-anthryl))phenyl}amino)phenyl] diphenylamine.

13. A thin film EL device comprising at least:
a hole-injecting electrode;
an electron-injecting electrode opposed to said hole-injecting electrode; and
a luminescent layer sandwiched between said hole-injecting electrode and said electron-injecting electrode, said luminescent layer containing a compound represented by the following general formula (9):

(9)

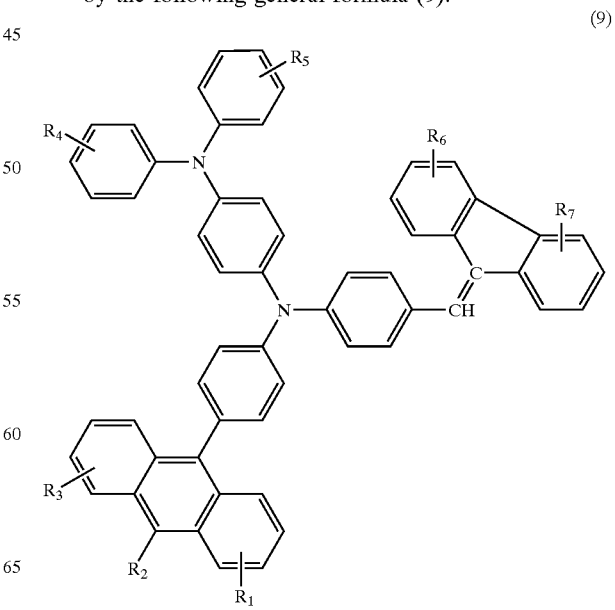

where R4, R5, R6, and R7 may be the same or different, and each independently represents a hydrogen atom, an alkyl group, or an alkoxy group; and R1, R2, and R3 may be the same or different, and each independently represents a hydrogen atom or an electron-donating substituent.

14. A thin film EL device according to claim 13, wherein said compound represented by the general formula (9) is (4-{[4-(fluorene-9-ylidenmethyl)phenyl][4-(9-anthryl)phenyl]amino}phenyl)diphenylamine.

15. A thin film EL device according to claim 13, wherein said compound represented by the general formula (9) is (4-{[4-(fluorene-9-ylidenmethyl)phenyl][4-(10-methoxy(9-anthryl))phenyl]amino}phenyl)diphenylamine.

16. A thin film EL device comprising at least:

a hole-injecting electrode;

an electron-injecting electrode opposed to said hole-injecting electrode; and a luminescent layer sandwiched between said hole-injecting electrode and said electron-injecting electrode, said luminescent layer containing a compound represented by the following general formula (10):

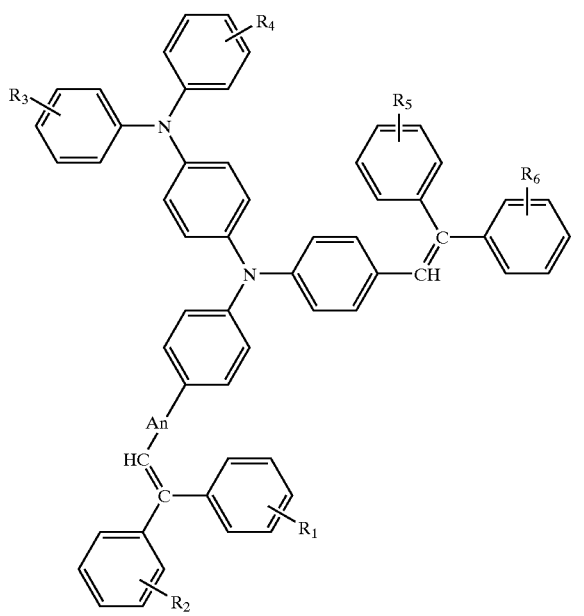

(10)

where R1, R2, R3, R4, R5, and R6 may be the same or different, and each independently represents a hydrogen atom, an alkyl group, or an alkoxy group; and An represents an arylene group composed of two or more substituted or unsubstituted fused rings.

17. A thin film EL device according to claim 16, wherein said compound represented by the general formula (10) is [4-({4-[10-(2,2-diphenylvinyl)(9-anthryl)]phenyl}[4-(2,2-diphenylvinyl)phenyl]amino)phenyl]diphenylamine.

18. A thin film EL device according to claim 16, wherein said compound represented by the general formula (10) is [4-({4-[10-(2,2-diphenylvinyl)(9-anthryl)]phenyl}{4-(2,2-diphenylvinyl)phenyl}amino)phenyl]bis(4-methoxyphenyl)amine.

19. A thin film EL device comprising at least:

a hole-injecting electrode;

an electron-injecting electrode opposed to said hole-injecting electrode; and a luminescent layer sandwiched between said hole-injecting electrode and said electron-injecting electrode, said luminescent layer containing a compound represented by the following general formula (11):

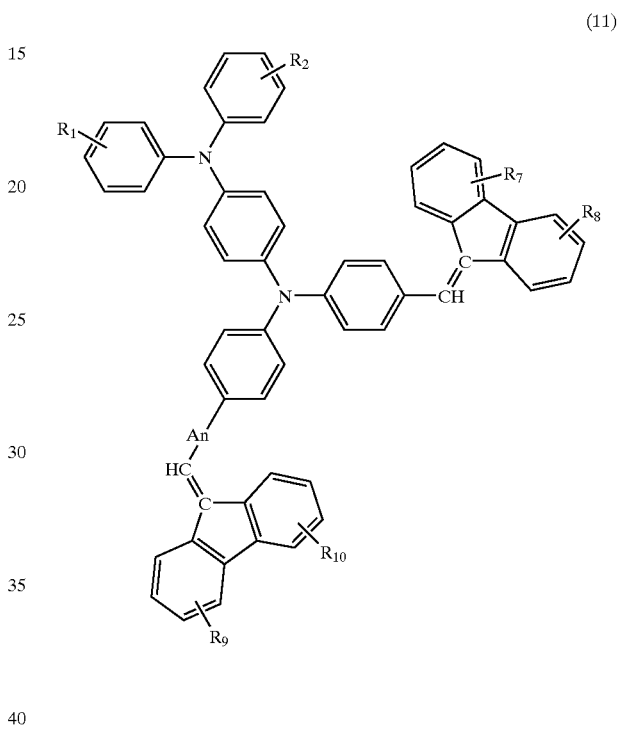

(11)

where R1, R2, R7, R8, R9, and R10 may be the same or different, and each independently represents a hydrogen atom, an alkyl group, or an alkoxy group; and An represents an arylene group composed of two or more substituted or unsubstituted fused rings.

20. A thin film EL device according to claim 19, wherein said compound represented by the general formula (11) is [4-({4-[10-(fluorene-9-ylidenmethyl)(9-anthryl)]phenyl}[4-(fluorene-9-ylidenmethyl)phenyl]amino)phenyl]diphenylamine.

21. A thin film EL device according to claim 19, wherein said compound represented by the general formula (11) is [4-({4-[10-(fluorene-9-ylidenmethyl)(9-anthryl)]phenyl}[4-(fluorene-9-ylidenmethyl)phenyl]amino)phenyl]bis(4-methoxyphenyl)amine.

22. A thin film EL device comprising at least:

a hole-injecting electrode;

an electron-injecting electrode opposed to said hole-injecting electrode; and a luminescent layer sandwiched between said hole-injecting electrode and said electron-injecting electrode, said luminescent layer containing a compound represented by the following general formula (12):

(12)

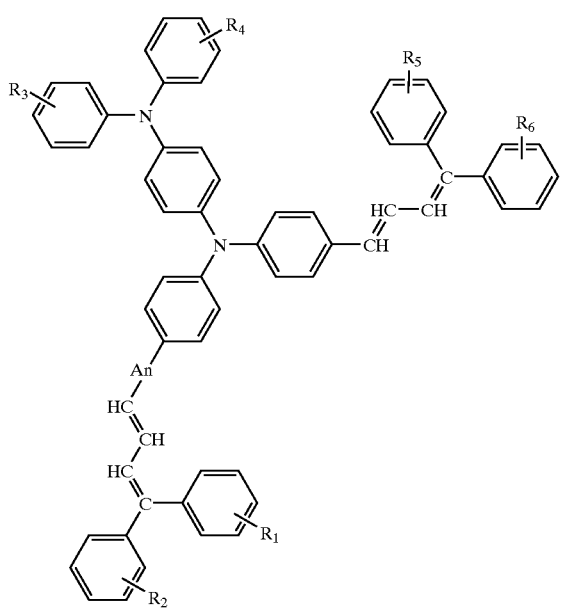

where R1, to R6 may be the same or different, and each independently represents a hydrogen atom, an alkyl group, or an alkoxy group; and An represents an arylene group composed of two or more substituted or unsubstituted fused rings.

23. A thin film EL device according to claim 22, wherein said compound represented by the general formula (12) is [4-({4-[10-(4,4-diphenylbuta-1,3-dienyl)(9-anthryl)]phenyl}[4-(4,4-diphenylbuta-1,3-dienyl)phenyl]amino)phenyl]diphenylamine.

24. A thin film EL device according to claim 22, wherein said compound represented by the general formula (12) is [4-({4-[10-(4,4-diphenylbuta-1,3-dienyl)(9-anthryl)]phenyl}{4-(4,4-diphenylbuta-1,3-dienyl)phenyl}amino)phenyl]bis(4-methoxyphenyl)amine.

25. A thin film EL device comprising at least:
a hole-injecting electrode;
an electron-injecting electrode opposed to said hole-injecting electrode; and
a luminescent layer sandwiched between said hole-injecting electrode and said electron-injecting electrode, said luminescent layer containing a compound represented by the following general formula (13):

(13)

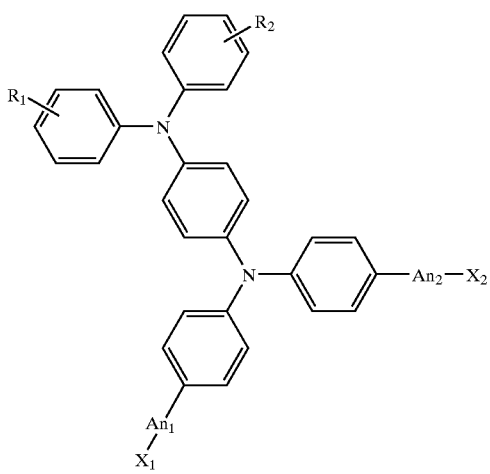

where R1, and R2 may be the same or different, and each independently represents a hydrogen atom, an alkyl group, or an alkoxy group; An1 and An2 may be the same or different, and each independently represents an arylene group composed of two or more substituted or unsubstituted fused rings; and X1 and X2 may be the same or different, and each independently represents a substituted or unsubstituted 2,2-diphenylvinyl group, 4,4-diphenylbuta-1,3-dienyl group, or fluorene-9-ylidenmethyl group.

26. A thin film EL device according to claim 25, wherein said compound represented by the general formula (13) is [4-(bis{4-[10-(2,2-diphenylvinyl)(9-anthryl)]phenyl}amino)phenyl]diphenylamine.

27. A thin film EL device according to claim 25, wherein said compound represented by the general formula (13) is [4-(bis{4-[10-(4,4-diphenylbuta-1,3-dienyl)(9-anthryl)]phenyl}amino)phenyl]diphenylamine.

28. A thin film EL device according to claim 25, wherein said compound represented by the general formula (13) is [4-(bis{4-[10-(fluorene-9-ylidenmethyl)(9-anthryl)]phenyl}amino)phenyl]diphenylamine.

29. A thin film EL device comprising at least:
a hole-injecting electrode;
an electron-injecting electrode opposed to said hole-injecting electrode; and
a luminescent layer sandwiched between said hole-injecting electrode and said electron-injecting electrode, said luminescent layer containing a compound represented by the following general formula (14):

(14)

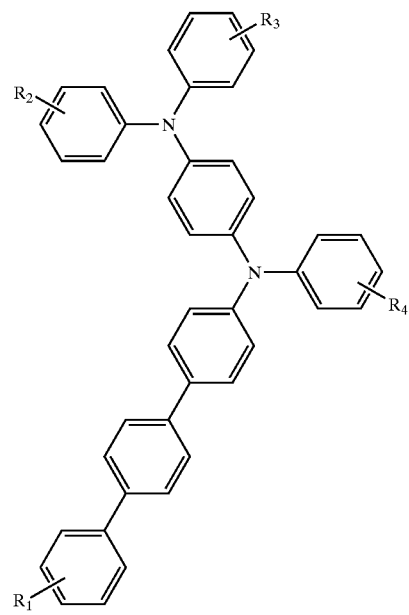

where R4 represents a hydrogen atom, an alkyl group, an alkoxy group, or an aralkyl group; and R1, R2, and R3 may be the same or different, and each independently represents a hydrogen atom, an alkyl group, or an alkoxy group.

30. A thin film EL device according to claim 29, wherein said compound represented by the general formula (14) is [4-(diphenylamino)phenyl][4-(4-phenylphenyl)phenyl]phenylamine.

31. A thin film EL device according to claim 29, wherein said compound represented by the general formula (14) is [4-{bis(4-methoxyphenyl)amino}phenyl][4-{4-(4-methoxyphenyl)phenyl}phenyl][4-(1-methyl-1-phenylethyl)phenyl]amine.

* * * * *